US012681246B2

(12) United States Patent
Yen et al.

(10) Patent No.: US 12,681,246 B2
(45) Date of Patent: Jul. 14, 2026

(54) ELECTRONIC PACKAGE HAVING CONNECTOR FOR GUIDING LIGHT CARRYING MEDIUM

(71) Applicant: Advanced Semiconductor Engineering, Inc., Kaohsiung (TW)

(72) Inventors: Han-Chee Yen, Kaohsiung (TW); Min-Yao Cheng, Kaohsiung (TW); Hung-Yi Lin, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 592 days.

(21) Appl. No.: 17/838,099

(22) Filed: Jun. 10, 2022

(65) Prior Publication Data

US 2023/0400648 A1 Dec. 14, 2023

(51) Int. Cl.
G02B 6/42 (2006.01)
H10W 90/00 (2026.01)

(52) U.S. Cl.
CPC ........... G02B 6/4246 (2013.01); G02B 6/428 (2013.01); H10W 90/00 (2026.01)

(58) Field of Classification Search
CPC ...... G02B 6/4246; G02B 6/428; H01L 25/167
USPC ......................................................... 257/84
See application file for complete search history.

(56) References Cited

U.S. PATENT DOCUMENTS

| | | | | |
|---|---|---|---|---|
| 8,971,676 B1 * | 3/2015 | Thacker | .................. | G02B 6/428 |
| | | | | 385/14 |
| 9,698,564 B1 * | 7/2017 | Shubin | .................... | H01S 5/026 |

| | | | | |
|---|---|---|---|---|
| 11,017,770 B2 * | 5/2021 | Choi | .................... | G10L 15/1822 |
| 11,493,713 B1 * | 11/2022 | Mendoza | ................ | H01L 24/47 |
| 2004/0252951 A1 * | 12/2004 | Nagasaka | ............ | G02B 6/4206 |
| | | | | 385/88 |
| 2005/0058408 A1 * | 3/2005 | Colgan | ................ | G02B 6/4214 |
| | | | | 385/89 |
| 2005/0156310 A1 * | 7/2005 | Benner | ................ | G02B 6/4249 |
| | | | | 257/712 |
| 2012/0207426 A1 * | 8/2012 | Doany | ................... | G02B 6/426 |
| | | | | 257/E33.056 |
| 2014/0177625 A1 * | 6/2014 | Chang | ...................... | G02B 6/43 |
| | | | | 398/45 |
| 2014/0270784 A1 * | 9/2014 | Thacker | ................. | H04B 10/27 |
| | | | | 398/115 |
| 2016/0116688 A1 * | 4/2016 | Hochberg | ............ | G02B 6/4232 |
| | | | | 385/14 |
| 2016/0216445 A1 * | 7/2016 | Thacker | ............... | G02B 6/4219 |
| 2017/0123173 A1 * | 5/2017 | Ji | ........................ | G02B 6/12004 |
| 2017/0207600 A1 * | 7/2017 | Klamkin | ................. | H01S 5/142 |

(Continued)

FOREIGN PATENT DOCUMENTS

| | | | |
|---|---|---|---|
| CN | 104007521 | * | 8/2014 |
| CN | 110646898 | * | 1/2020 |

(Continued)

*Primary Examiner* — Sheng-Bai Zhu
(74) *Attorney, Agent, or Firm* — Foley and Lardner LLP

(57) ABSTRACT

The present disclosure provides an electronic package. The electronic package includes a photonic component including a first input/output (I/O) port and a second I/O port both at a side of the photonic component. The electronic package also includes a connector disposed adjacent to the side of the photonic component and configured to guide a first light carrying medium to be optically coupled with at least one of the first I/O port and second I/O port of the photonic component.

20 Claims, 46 Drawing Sheets

1

(56) References Cited

U.S. PATENT DOCUMENTS

| | | | | |
|---|---|---|---|---|
| 2017/0254968 | A1* | 9/2017 | Ding | H01L 24/20 |
| 2019/0004247 | A1* | 1/2019 | Huang | G02B 6/12002 |
| 2019/0041576 | A1* | 2/2019 | Byrd | G02B 6/12004 |
| 2019/0137706 | A1* | 5/2019 | Xie | G02B 6/4274 |
| 2021/0132309 | A1* | 5/2021 | Zhang | G02B 6/4249 |
| 2021/0223489 | A1* | 7/2021 | Weng | H01L 24/16 |
| 2021/0345024 | A1* | 11/2021 | Leigh | H04Q 11/0005 |
| 2021/0366802 | A1* | 11/2021 | Huang | H01L 25/167 |
| 2022/0155521 | A1* | 5/2022 | Yu | G02B 6/13 |
| 2022/0342165 | A1* | 10/2022 | Wilkerson | G02B 6/425 |
| 2022/0367431 | A1* | 11/2022 | Chen | H01L 25/0655 |
| 2023/0060862 | A1* | 3/2023 | Patel | G02B 6/423 |
| 2023/0077979 | A1* | 3/2023 | Winzer | H04B 10/801 |
| | | | | 398/116 |

FOREIGN PATENT DOCUMENTS

| | | | |
|---|---|---|---|
| WO | WO 2008018620 | * | 2/2008 |
| WO | WO 2019234323 | * | 12/2019 |

* cited by examiner

23

23t

ELECTRONIC PACKAGE HAVING CONNECTOR FOR GUIDING LIGHT CARRYING MEDIUM

BACKGROUND

1. Technical Field

The present disclosure relates to an electronic package.

2. Description of the Related Art

Silicon photonics is a technology that is being researched and developed worldwide, due to its promise of high-speed communication and low power consumption. Conventionally, optical couplers (such as grating couplers and edge couplers) are provided on a photonic chip to couple optical signals between optical fibers and photonic components (such as photonic integrated circuits (PICs)).

To support higher transmission data rate over a wider bandwidth, it is desirable to achieve a higher number of connections between the optical fibers and photonic components. In addition, the ability to precisely align the optical fibers and the photonic components becomes more important.

SUMMARY

Embodiments of the present disclosure provide an electronic package. The electronic package includes a photonic component including a first input/output (I/O) port and a second I/O port both at a side of the photonic component. The electronic package also includes a connector disposed adjacent to the side of the photonic component and configured to guide a first light carrying medium to be optically coupled with at least one of the first I/O port and second I/O port of the photonic component.

Embodiments of the present disclosure provide an electronic package. The electronic package includes a carrier and an optical transceiver disposed over the carrier. The optical transceiver includes a surface facing away from the carrier. The electronic package also includes a plurality of light carrying mediums disposed on the surface of the optical transceiver along at least two dimensions.

Embodiments of the present disclosure provide an electronic package. The electronic package includes a connector having an opening, an I/O port disposed within the opening from a top view, and a first set of conductive pillars electrically connected to the connector. The first set of conductive pillars are configured to maintain a distance between a top surface of the connector and the I/O port.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

FIG. 5A, FIG. 5B, FIG. 5C, FIG. 5D, FIG. 5E, FIG. 5F, FIG. 5F-1, FIG. 5G, FIG. 5H, FIG. 5I, FIG. 5J, FIG. 5K, FIG. 5L, FIG. 5M and FIG. 5N illustrate cross-sectional views in one or more stages of a method of manufacturing an electronic package in accordance with an embodiment of the present disclosure.

DETAILED DESCRIPTION

Figure 1:
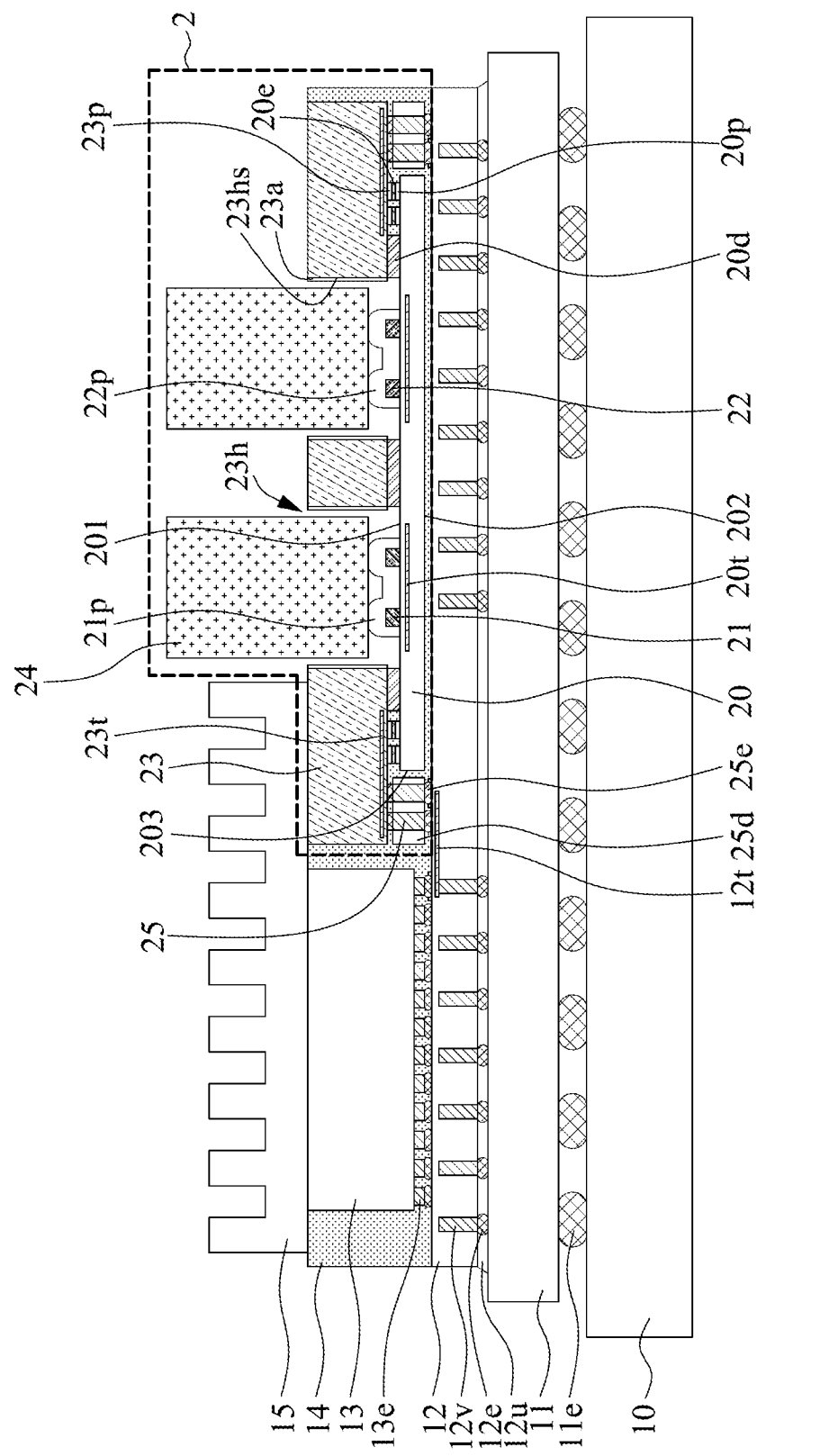
FIG. 1 illustrates a cross-sectional view of an electronic package in accordance with some embodiments of the present disclosure.

The following disclosure provides for many different embodiments, or examples, for implementing different features of the provided subject matter. Specific examples of components and arrangements are described as follows to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 illustrates a cross-sectional view of an electronic package 1 in accordance with some embodiments of the present disclosure.

In some embodiments, the electronic package 1 may include or be a part of a system-in-package (SiP) module. The electronic package 1 may include one or more electronic components (such as electronic integrated circuits (EICs)) and one or more photonic components (such as photonic integrated circuits (PICs)).

In some embodiments, the electronic package 1 may include an optical module. For example, the electronic package 1 may be operable to communicate with an external component through optical signals. "Optical signals" used herein includes continuous wave (CW) light and/or pulses of light.

Referring to FIG. 1, the electronic package 1 may include carriers 10, 11, 12, electronic component 13, an encapsulating layer 14, a heat dissipating element 15 and a structure 2.

The carriers 10, 11 and 12 may be stacked on one another. For example, the carrier 11 may be disposed on the carrier 10 and may be electrically connected with the carrier 10 through an electrical contact 11e. The carrier 12 may be disposed on the carrier 11 and may be electrically connected with the carrier 11 through an electrical contact 12e.

The carriers 10 and 11 may each include a substrate. In some embodiments, the carriers 10 and 11 may each include, for example, a printed circuit board (PCB), such as a paper-based copper foil laminate, a composite copper foil laminate, or a polymer-impregnated glass-fiber-based copper foil laminate. In some embodiments, the carriers 10 and 11 may each include an interconnection structure, such as a redistribution layer (RDL) and a grounding element.

In some embodiments, the carrier 12 may include, for example, an interposer. In some embodiments, the carrier 12 may include interposer-like wirings to form a structure which may be regarded as an interposer or a fan-out substrate. In addition, the carrier 12 may include a connector 12v to provide electrical connections for the carrier 11, the electronic component 13 and the structure 2. The connector 12v may include a conductive pillar, a conductive via, a conductive trace, a conductive wire, or other feasible connectors. Each connector 12v may be provided with one of the electrical contacts 12e.

In some embodiments, the electrical contacts 11e and 12e may each include a reflowable conductive material, such as a soldering material. In some embodiments, the electrical contacts 11e and 12e may each include one or more solder balls or solder bumps, such as a controlled collapse chip connection (C4) bump, a ball grid array (BGA) or a land grid array (LGA). In some embodiments, an underfill 12u may be disposed between the carrier 12 and the carrier 11. The underfill 12u may cover, surround or encapsulate the electrical contact 12e.

The positions, functions, and number of carriers in the electronic package 1 are not intended to limit the present disclosure. For example, there may be any number of carriers in the electronic package 1 due to design requirements.

The structure 2 and the electronic component 13 may be disposed on the carrier 12. The structure 2 and the electronic component 13 may be spaced apart from each other. The structure 2 and the electronic component 13 may be physically separated by the encapsulating layer 14. The structure 2 and the electronic component 13 may be electrically connected with each other through the carrier 12. For example, a conductive pillar 25 of the structure 2 and an electrical contact 13e of the electronic component 13 may be electrically connected with each other through a conductive trace or wire 12t in the carrier 12.

The structure 2 may be configured to support the optical communication between the electronic package 1 and an external component. The structure 2 may function as an optical transceiver and an optical interface that connects to an external component through a light carrying medium 24 (which may include a fiber optic cable or an optical fiber). The structure 2 may include one or more photonic components.

In some embodiments, photonic components (such as PICs) may be incorporated or provided in the structure 2. Examples of the photonic components may include optical transmitters (such as transmitter 22), optical receivers (such as receiver 21), optical modulators, optical waveguides, optical splitters, optical combiners, optical grating couplers, etc. The functionalities supported by the photonic components in the structure 2 may include light emitting, light receiving/detecting, optical modulating, optical routing, optical to electrical converting, etc. The details of the structure 2 may be described with respect to FIG. 2A.

The electronic component 13 may be a chip or a die including a semiconductor substrate, one or more integrated circuit devices and one or more overlying interconnection structures therein. In some embodiments, the electronic component 13 may include a controller, a processor, a central processing unit (CPU), a field-programmable gate array (FPGA), an application specific integrated circuit (ASIC), etc. The electronic component 13 may include a single chip or a plurality of chips. In some embodiments, there may be any number of electronic components depending on design requirements. The electronic component 13 may be electrically connected to one or more other electrical components and to the carrier 12, and the electrical connections may be attained by way of flip-chip (such as by utilizing the electrical contact 13e) or wire-bond techniques.

In some embodiments, electronic components (such as EIC) may be incorporated or provided in the electronic component 13 and/or the carrier 12 to provide electronic functions for the structure 2. More specifically, electronic components may be configured to control the photonic components in the structure 2 and to process signals (including optical signals and electronic signals) in the structure 2. Examples of the electronic components may include transistors, capacitors, resistors, inductors, transimpedance and limiting amplifiers (TIA/LAs), driver circuits, control circuits, etc.

In some embodiments, optical signals from an optical source external to the electronic package 1 may be received by, for example, the receiver 21 (e.g., a photodiode (PD)) of the structure 2. The receiver 21 may convert optical signals into electrical signals that are communicated to electronic components (which may be in the electronic component 13 and/or the carrier 12) to process (e.g., analysis, modify, synthesize, convert to a digital signal, and amplify, etc.), to store, and/or to transmit the electrical signals.

In some embodiments, the electronic component 13 (e.g., an ASIC) may generate electronic signals to a driver die (which may be in the electronic component 13 and/or the carrier 12) for driving the photonic components in the structure 2. The electronic signals may be communicated to the transmitter 22 (e.g., a light-emitting diode (LED) or a vertical-cavity surface-emitting laser (VCSEL)), which outputs optical signals. The transmitter 22 may convert electrical signals into optical signals.

The encapsulating layer 14 may be disposed on the carrier 12. The structure 2 and the electronic component 13 may each be partially surrounded or covered by the encapsulating layer 14. In some embodiments, the encapsulating layer 14 may include an epoxy resin having fillers, a molding compound (e.g., an epoxy molding compound or other molding compound), a polyimide, a phenolic compound or material, a material with a silicone dispersed therein, or a combination thereof.

The heat dissipating element 15 may be disposed on the structure 2 and the electronic component 13. The heat dissipating element 15 may include a heat sink, such as heat dissipation fins. The heat dissipating element 15 may be disposed over a part of a connector 23 of the structure 2. The heat dissipating element 15 may be configured to provide a heat dissipation path. The heat dissipating element 15 may be configured to dissipate heat from the structure 2 and the electronic component 13. In some embodiments, the heat dissipating element 15 may be connected to the structure 2 and the electronic component 13 through an adhesive layer, such as a heat dissipation gel.

Figure 2A:
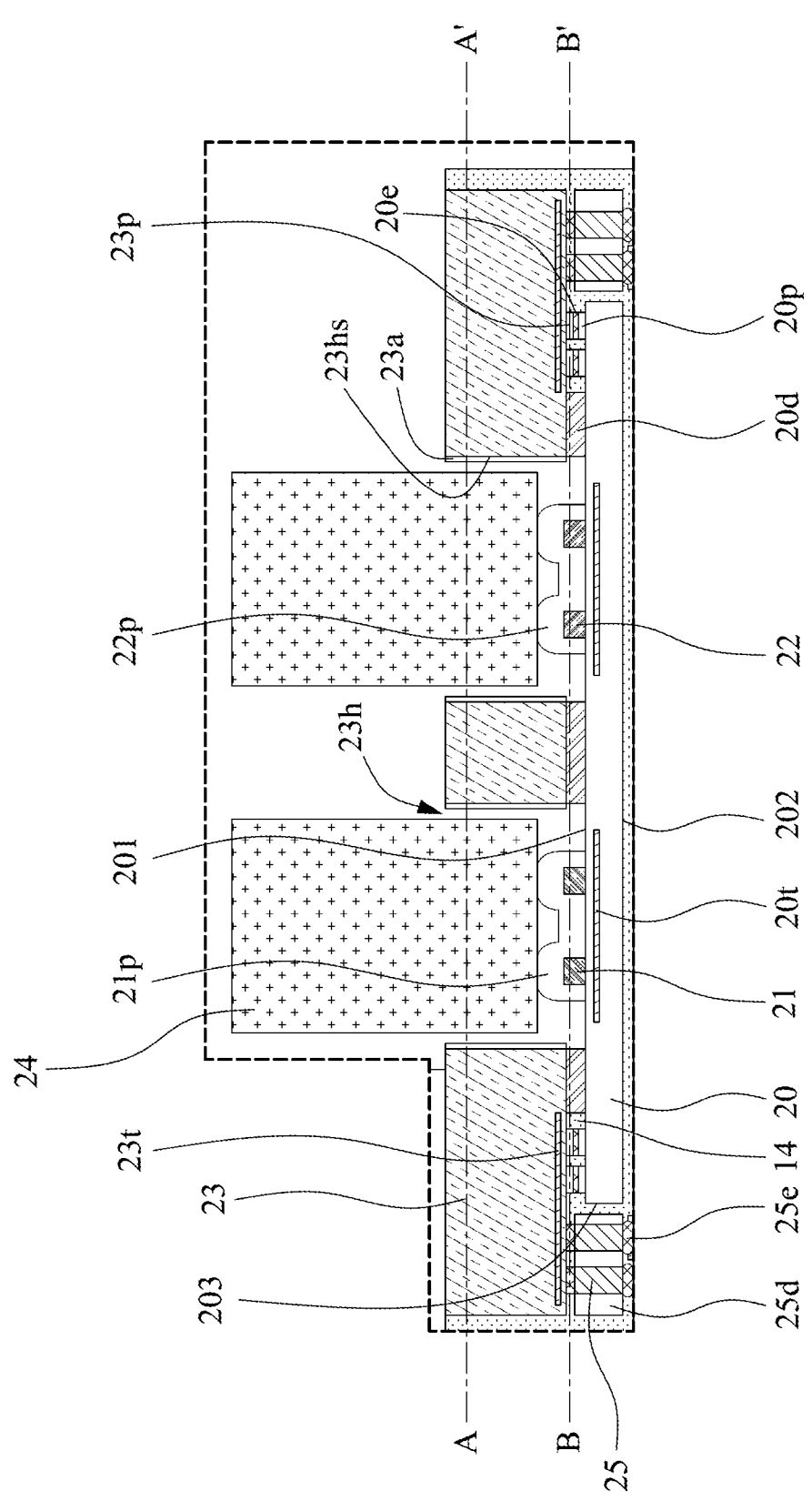
FIG. 2A illustrates a cross-sectional view of a part of the electronic package of FIG. 1 in accordance with some embodiments of the present disclosure.

FIG. 2A illustrates a cross-sectional view of the structure 2 of the electronic package of FIG. 1 in accordance with some embodiments of the present disclosure. The structure 2 may include a component 20, a receiver 21, a transmitter 22, a connector 23, a light carrying medium 24 and a conductive pillar 25.

In some embodiments, the component 20 may include a photonic component or a photonic chip. In some embodiments, the component 20 may include a substrate or a material platform from which photonic components can be made. In some arrangements, the component 20 may include a substrate having a silicon material. In some arrangements, the component 20 may include a Silicon on Insulator (SOI) substrate including a silicon substrate, an oxide layer disposed on the silicon substrate, and a silicon layer (e.g., an active silicon photonic layer) disposed on the oxide layer. In some embodiments, the component 20 may include an optical transceiver. In some embodiments, the component 20 may include an optical interface.

For example, the component 20 may include the receiver 21 and the transmitter 22. Conductive traces or wires 20t may be formed in the component 20 and may be electrically connected to the receiver 21 and/or the transmitter 22. For ease of description, the component 20 is used as an example for specific descriptions in specific embodiments of the present invention. Configuration or application of the component 20 in the figures is for illustrative purposes only, and is not intended to limit the present disclosure. For example, the component 20 may include more photonic components, such as optical transmitters, optical receivers, optical modulators, optical waveguides, optical splitters, optical combiners, optical grating couplers, etc. The component 20 may include both photonic components and electronic components or may include only photonic components.

The component 20 and the electronic component 13 in FIG. 1 may be next to each other or side-by-side. For example, the component 20 and the electronic component 13 in FIG. 1 may be at least partially overlapped in a direction substantially parallel to the surface 201. In some embodiments where an electronic component (such as EIC) is incorporated or provided in the electronic component 13, the component 20 and the electronic component may be next to each other or side-by-side.

The component 20 may be stacked on the carrier 12 in FIG. 1. For example, the component 20 and the carrier 12 in FIG. 1 may be at least partially overlapped in a direction substantially perpendicular to a surface 201 of the component 20. In some embodiments where an electronic component (such as an EIC) is incorporated or provided in the carrier 12, the component 20 may be stacked on the electronic component.

In some embodiments, the component 20 may include a surface 201, a surface 202 opposite to the surface 201, and a surface (or a lateral surface) 203 extending between the surface 201 and the surface 202. In some embodiments, a thickness of the component 20 may be about 50 micrometers (μm) or less.

One or more receivers 21 may be disposed on the surface 201 of the component 20. The receiver 21 may include a photodiode (PD) that receives optical signals and converts optical signals into electrical signals. The receiver 21 may be provided on the surface 201 and protrude from the surface 201. However, in some other embodiments, the receiver 21 may be fabricated within the silicon layer of the component 20. In some embodiments, the receivers 21 may be arranged in an array (e.g., a PD array).

A protection layer 21p may be disposed on the surface 201 of the component 20 to cover the receiver 21. The protection layer 21p may include a light curable material, such as an ultraviolet (UV) glue, a polymerizable composition containing photoinitiators, and so on. The protection layer 21p may include a convex lens or a convex surface over the receiver 21. In some embodiments, the protection layer 21p may include a microlens array. The protection layer 21p may be configured to fix the light carrying medium 24 onto the receiver 21 and to couple optical signals from the light carrying medium 24 into the receiver 21. In some embodiments, the protection layer 21p may function as a collimator.

One or more transmitters 22 may be disposed on the surface 201 of the component 20. The transmitter 22 may include a light-emitting diode (LED) or a vertical-cavity surface-emitting laser (VCSEL) that is configured to emit or radiate light. The transmitter 22 may be provided on the surface 201 and protrude from the surface 201. However, in some other embodiments, the transmitter 22 may be fabricated within the silicon layer of the component 20. In some embodiments, the transmitters 22 may be arranged in an array (e.g., an LED array).

A protection layer 22p may be disposed on the surface 201 of the component 20 to cover the transmitter 22. The protection layer 22p may include a light curable material, such as a UV glue, a polymerizable composition containing photoinitiators, and so on. The protection layer 22p may include a convex lens or a convex surface over the transmitter 22. In some embodiments, the protection layer 22p may include a microlens array. The protection layer 22p may be configured to fix the light carrying medium 24 onto the transmitter 22 and to couple optical signals from the transmitter 22 into the light carrying medium 24. In some embodiments, the protection layer 22*p* may function as a collimator.

The connector 23 may be disposed on the surface 201 of the component 20. The connector 23 may extend beyond the surface 203 of the component 20. For example, the connector 23 may have an overhanging structure (or an overhang) protruding from the surface 203 of the component 20. For example, the connector 23 may have an overhanging structure which is not supported by the component 20. In some embodiments, the connector 23 may include a silicon substrate. However, in some other embodiments, the connector 23 may include a metal, a plastic, a ceramic, or other feasible materials.

The connector 23 may be electrically connected with the component 20 through a conductive pad 20*p* on the component 20, a conductive pad 23*p* on the connector 23 and an electrical contact 20*e*. The connector 23 may include a conductive trace or wire 23*t* for providing electrical connections between the conductive pillar 25 and the conductive pad 23*p*.

A dam, a barrier or a spacer 20*d* may be disposed on the surface 201 of the component 20. The dam 20*d* may be disposed between the component 20 and the connector 23. A distance or a gap between the component 20 and the connector 23 may be defined or maintained by the dam 20*d*. For example, the dam 20*d* may support or uphold the connector 23. For example, the dam 20*d* may keep the gap between the component 20 and the connector 23.

In some embodiments, the dam 20*d* may include a light curable material, such as an ultraviolet (UV) glue, a polymerizable composition containing photoinitiators, and so on.

The connector 23 may include one or more openings, holes or cavities 23*h* over the receiver 21 and the transmitter 22. For example, the receiver 21 and the transmitter 22 may each be exposed through one opening 23*h*. For example, in some embodiments, a PD array may be exposed through one opening 23*h* and an LED array may be exposed through another opening 23*h*.

The connector 23 may be configured to align the light carrying medium 24 and the photonic components (e.g., the receiver 21 and the transmitter 22) on the component 20. The connector 23 may be configured to facilitate, guide, direct or position the connection (e.g., the optical coupling) between the light carrying medium 24 and the photonic components (e.g., the receiver 21 and the transmitter 22) on the component 20. For example, the light carrying medium 24 may be partially disposed in the openings 23*h* and optically coupled to the receiver 21 or the transmitter 22. For example, the openings 23*h* may be configured to accommodate a portion of the light carrying medium 24. For example, a portion of the light carrying medium 24 may extend into the openings 23*h*.

In some embodiments, the dam 20*d* may be adjacent to the opening 23*h* of the connector 23. In some embodiments, the dam 20*d* may be configured to prevent the encapsulating layer 14 from flowing into the opening 23*h*. In some embodiments, a part of the dam 20*d* may be exposed from the opening 23*h* and apart of the dam 20*d* may be covered by the encapsulating layer 14.

In some embodiments, a surface of the dam 20*d* and an internal surface (or a sidewall) 23*hs* of the opening 23*h* may be substantially coplanar. Such a coplanar surface may be exposed through the opening 23*h*.

Figure 5A:
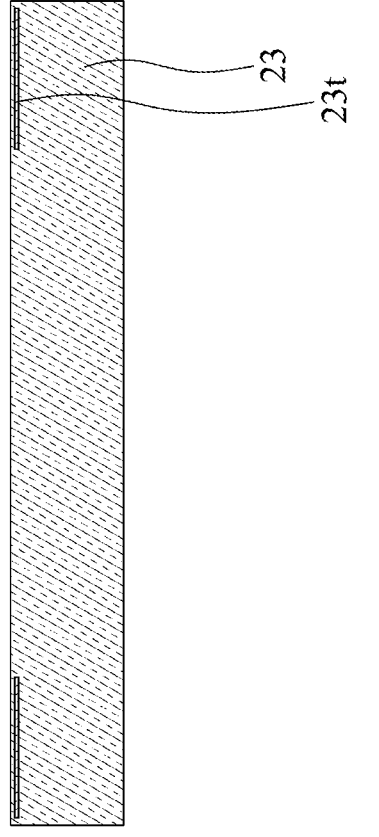
Figure 5B:
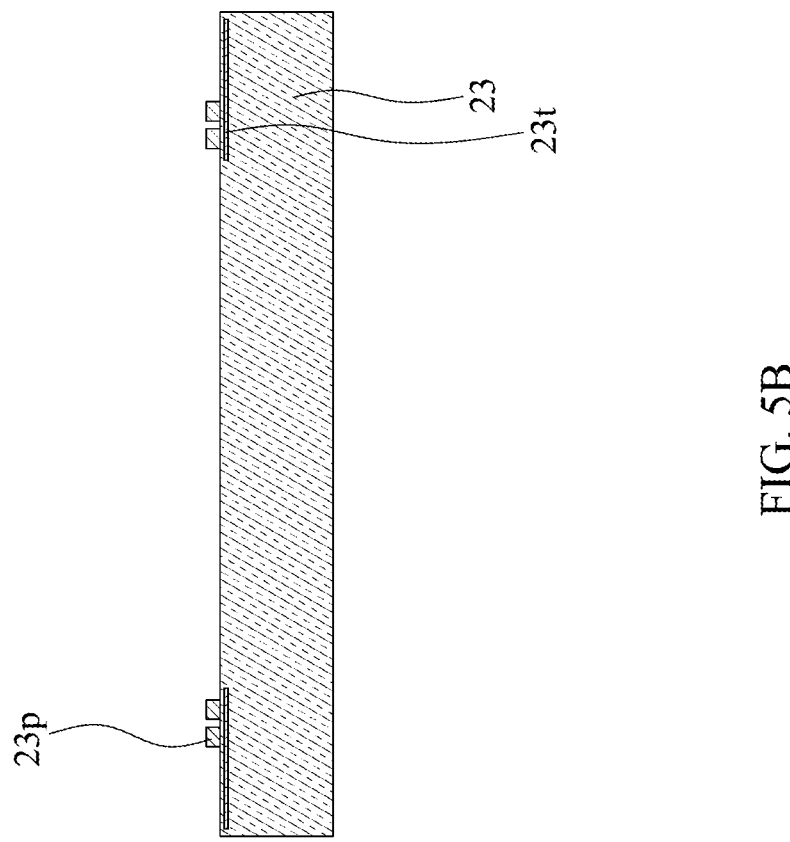
Figure 5C:
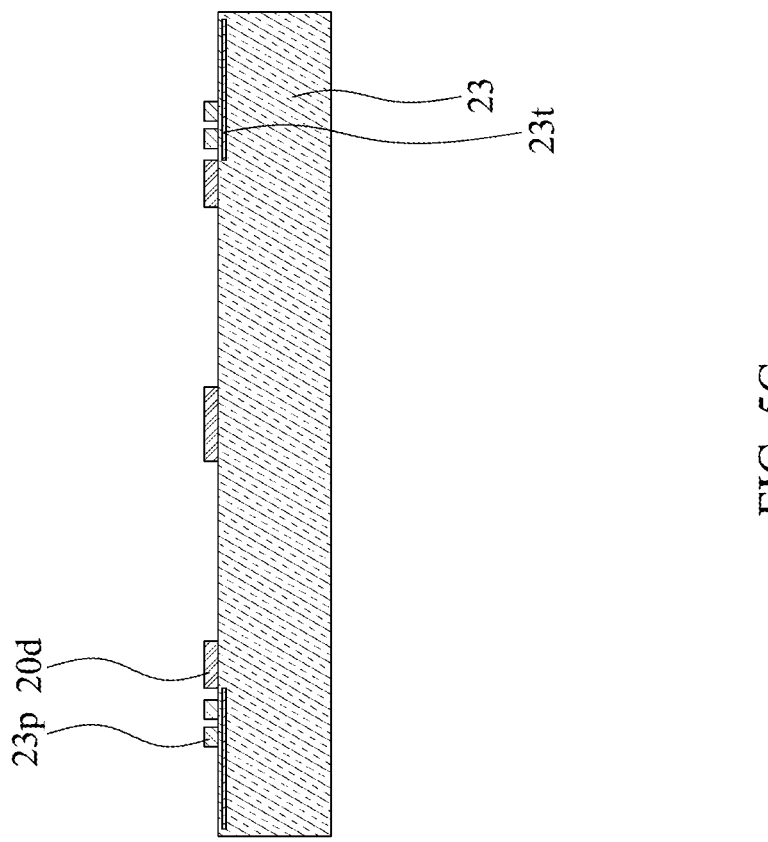
Figure 5D:
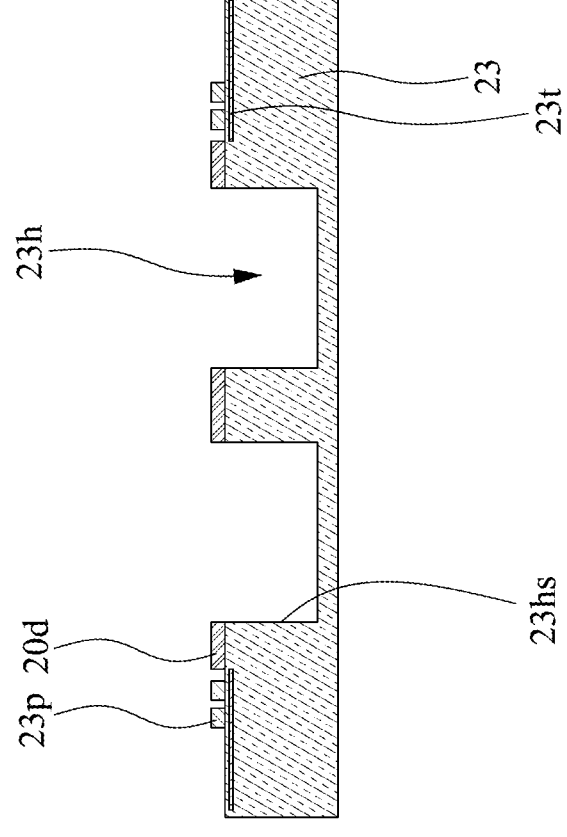

For example, as shown in FIG. 5D, the opening 23*h* may be formed by photolithography and anisotropic etching (e.g., deep reactive ion etching (DRIE)), or may be formed by a laser machining operation. Apart of the dam 20*d* may also be removed, forming a substantially coplanar surface.

In some embodiments, a width of the opening 23*h* may be constant. For example, the internal surface 23*hs* of the opening 23*h* may be substantially perpendicular to the surface 201 of the component 20.

In some embodiments, a coating 23*a* may be applied or formed on surfaces of the connector 23. The coating 23*a* may include an optical coating, such as an optical interference coating, an anti-reflection (AR) coating, an anti-reflective (AR) coating, or other coatings for reducing reflection. The coating 23*a* may include a refractive index matched to the air-to-silicon interface and may include, but is not limited to, silicon nitride. The coating 23*a* may be disposed on the internal surfaces 23*hs* of the openings 23*h*.

Figure 5E:
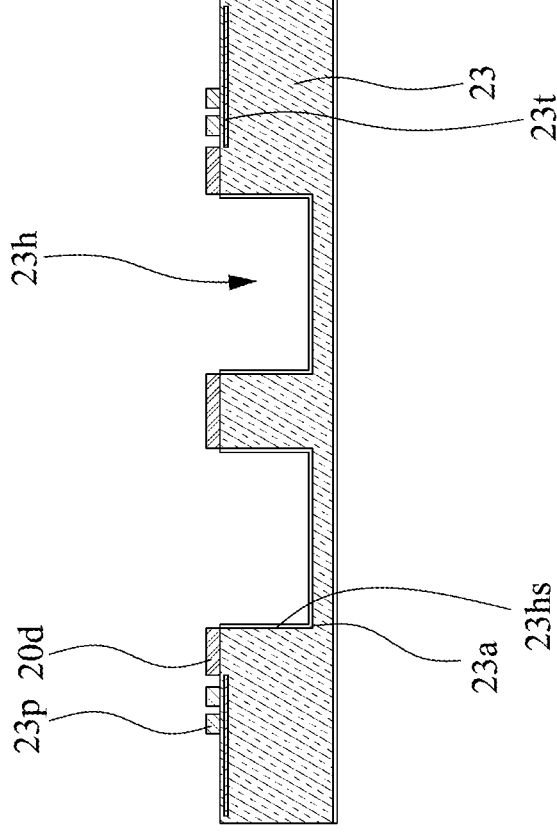
Figure 5F:
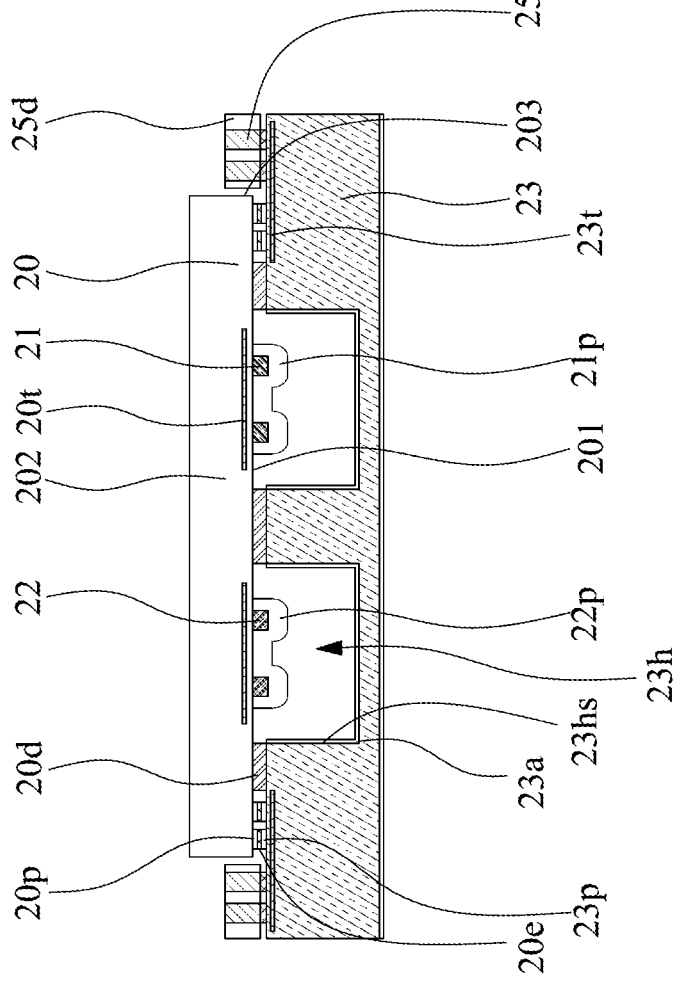
Figures 1, 5F:
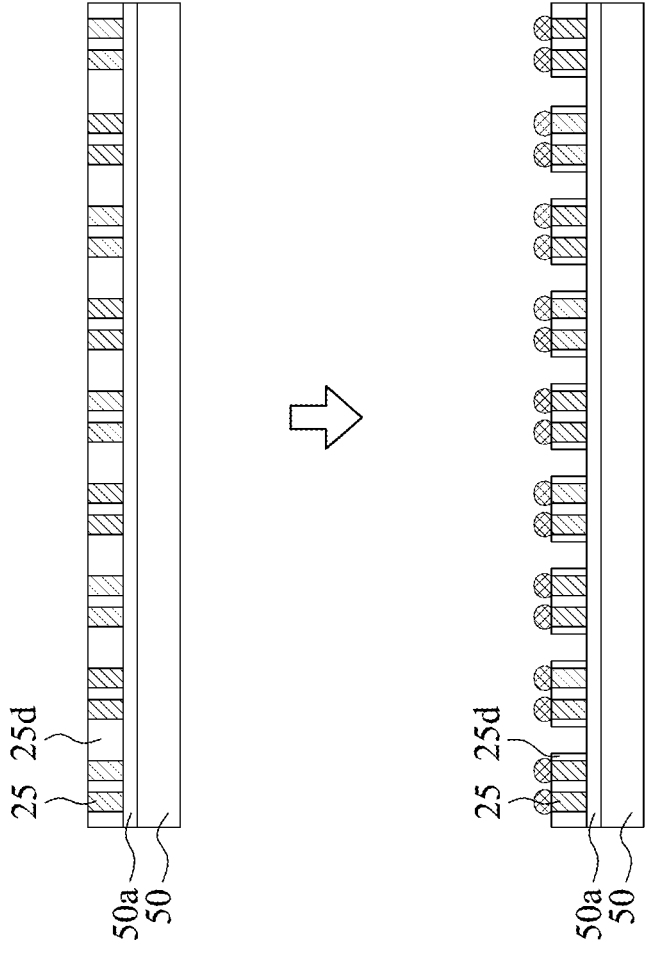
Figure 5G:
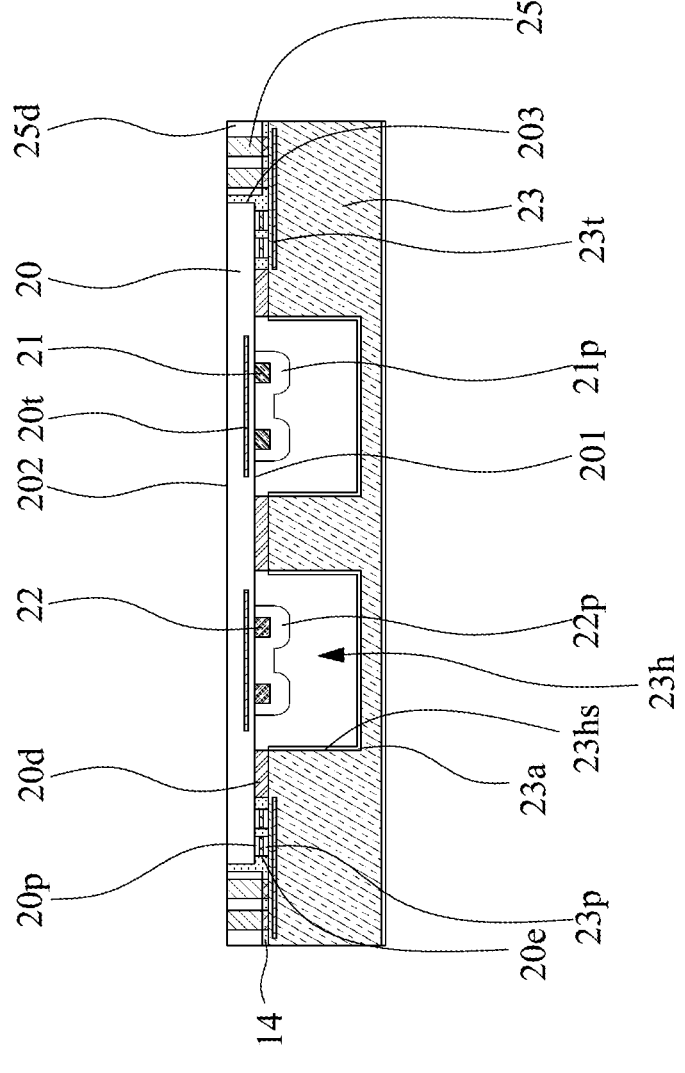
Figure 5H:
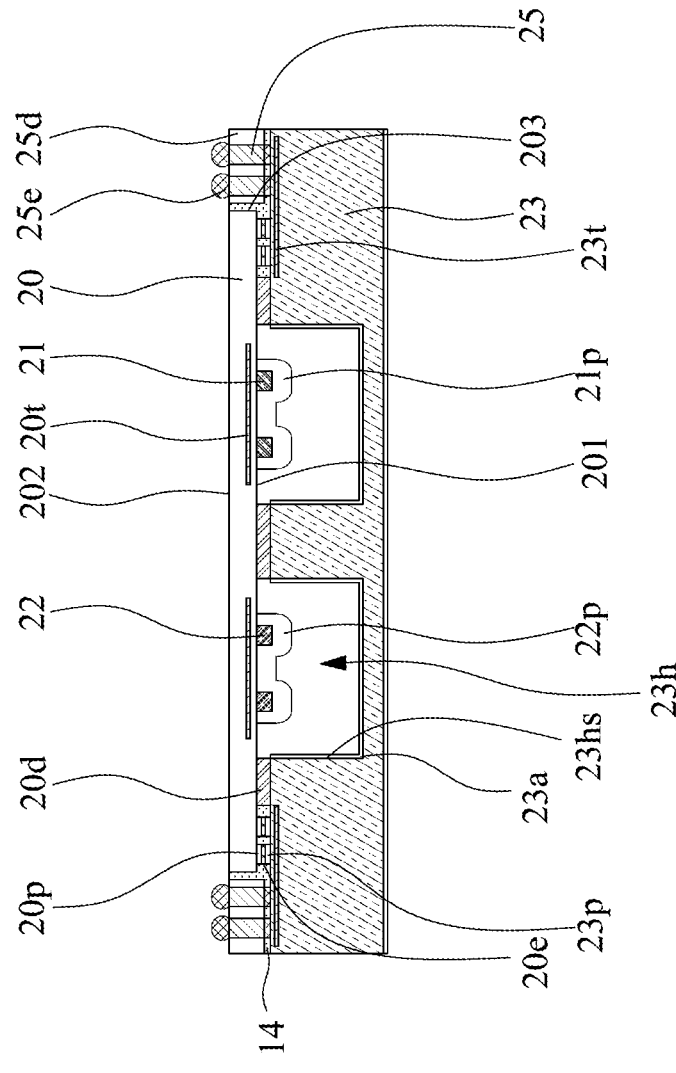

In some embodiments, as shown in FIG. 5H, an optical test may be conducted after the component 20 is disposed on the connector 23. However, the connector 23 may not allow light (such as in the spectrum of about 1200 nanometers (nm) to about 1800 nm) radiated by the transmitter 22 or by an external light source to pass through. The coating 23*a* may help increase throughput and reduce hazards caused by back-reflections. In some embodiments, the coating 23*a* may prevent or reduce light reflection. In some embodiments, the coating 23*a* may prevent light from interfering the adjacent optical component (such as the light carrying medium 24, the transmitter 22, and the receiver 21).

In some embodiments, the light carrying medium 24 may be surrounded by the coating 23*a*. In some embodiments, as shown, the light carrying medium 24 may be spaced apart from the coating 23*a*. However, in some other embodiments, the light carrying medium 24 may contact the coating 23*a*.

In some embodiments, the light carrying medium 24 may include a fiber optic cable or an optical fiber. The receiver 21 and the transmitter 22 may function as input/output (I/O) ports for supporting the optical communication between the electronic package 1 in FIG. 1 and an external component. For example, the light carrying medium 24 may be plugged into the opening 23*h* to optically couple to the receiver 21 or the transmitter 22.

In some embodiments, the light carrying medium 24 may be substantially perpendicular to the surface 201 of the component 20. For example, the light carrying medium 24 may extend in a direction substantially perpendicular to the surface 201 of the component 20. For example, the light carrying medium 24 may enable communication of optical signals vertically to and from the surface 201 of the component 20.

Figure 2B:
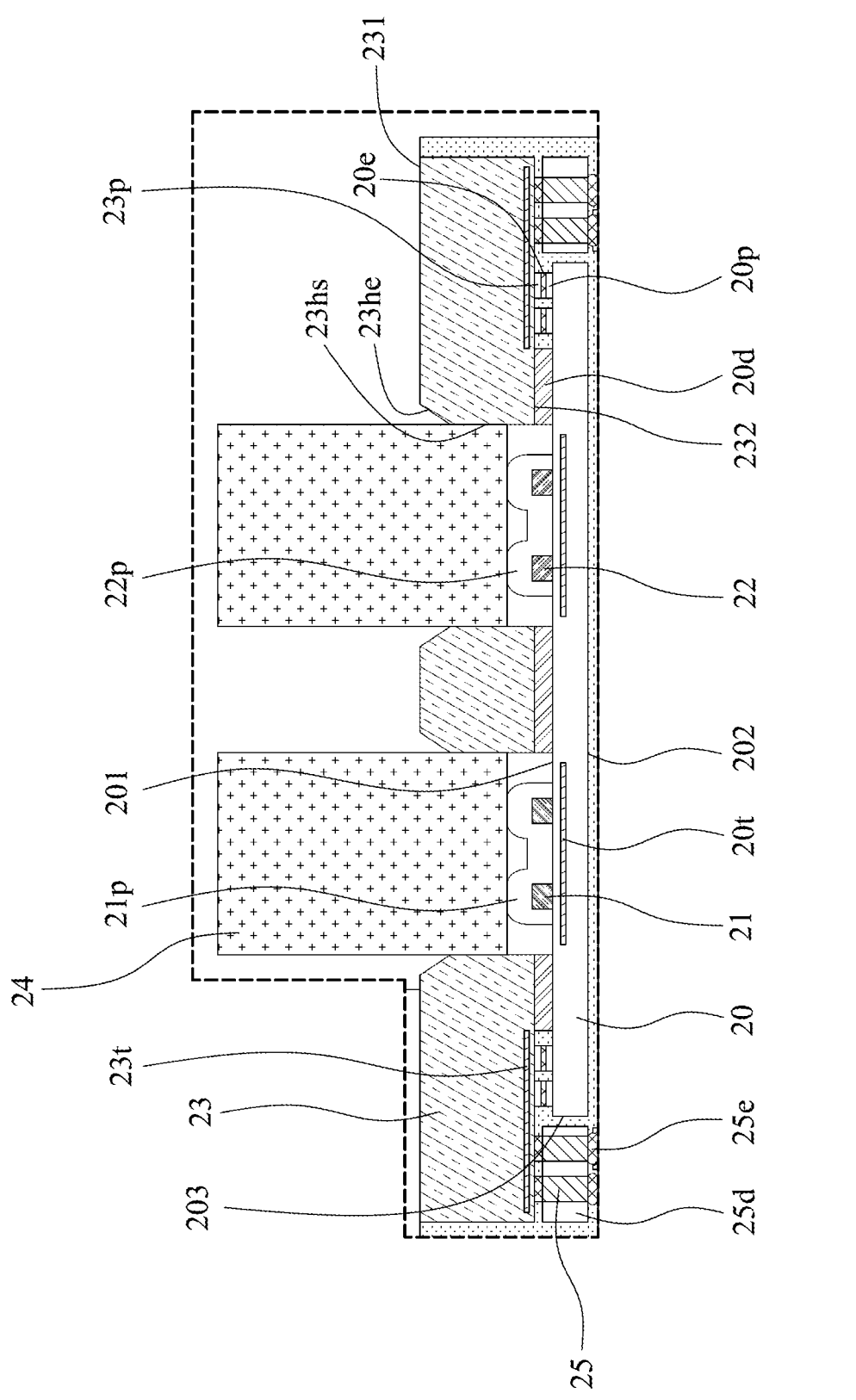
FIG. 2B illustrates a cross-sectional view of a part of an electronic package in accordance with some embodiments of the present disclosure.
Figure 2C:
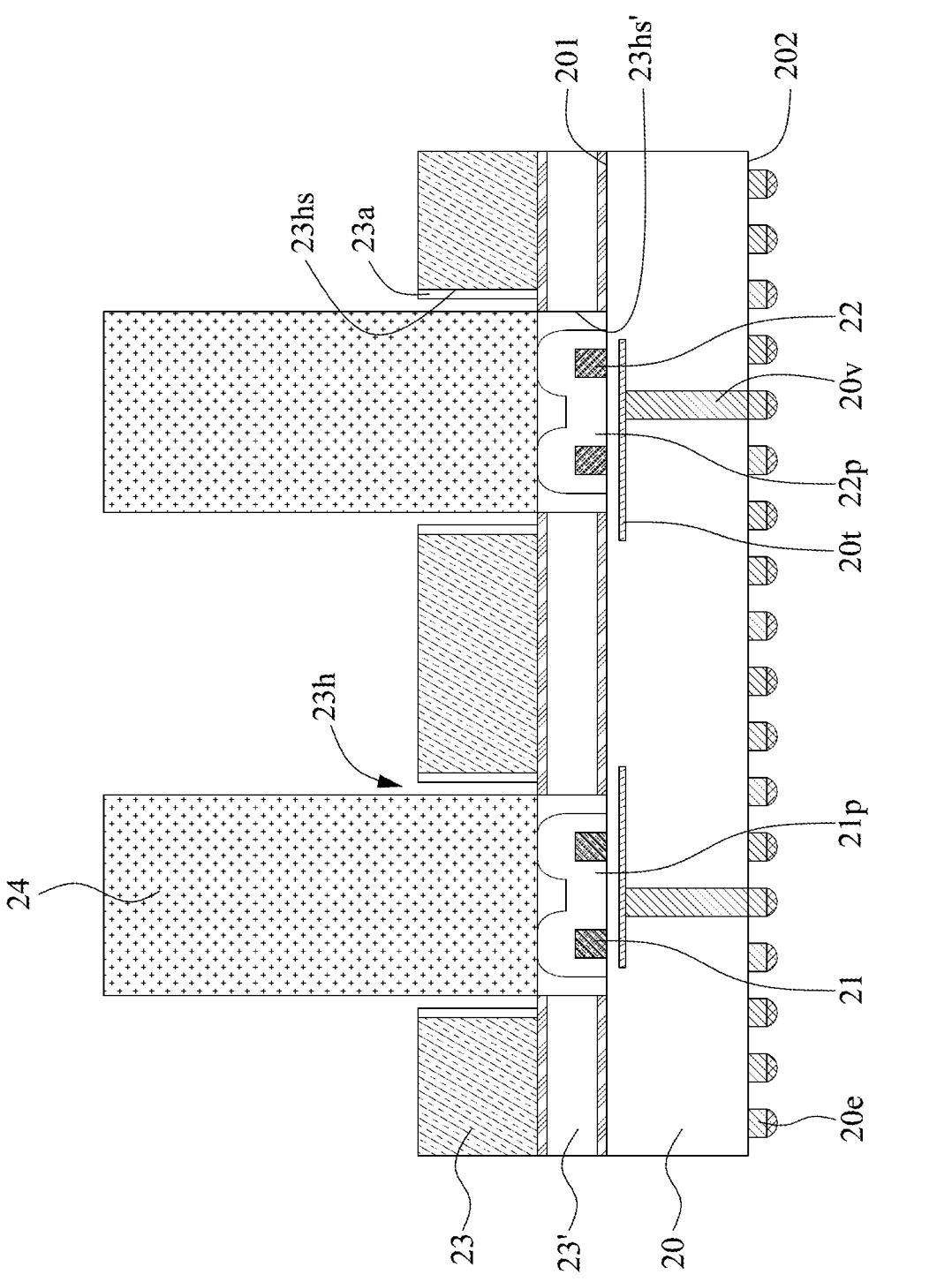
FIG. 2C illustrates a cross-sectional view of a part of an electronic package in accordance with some embodiments of the present disclosure.
Figure 2D:
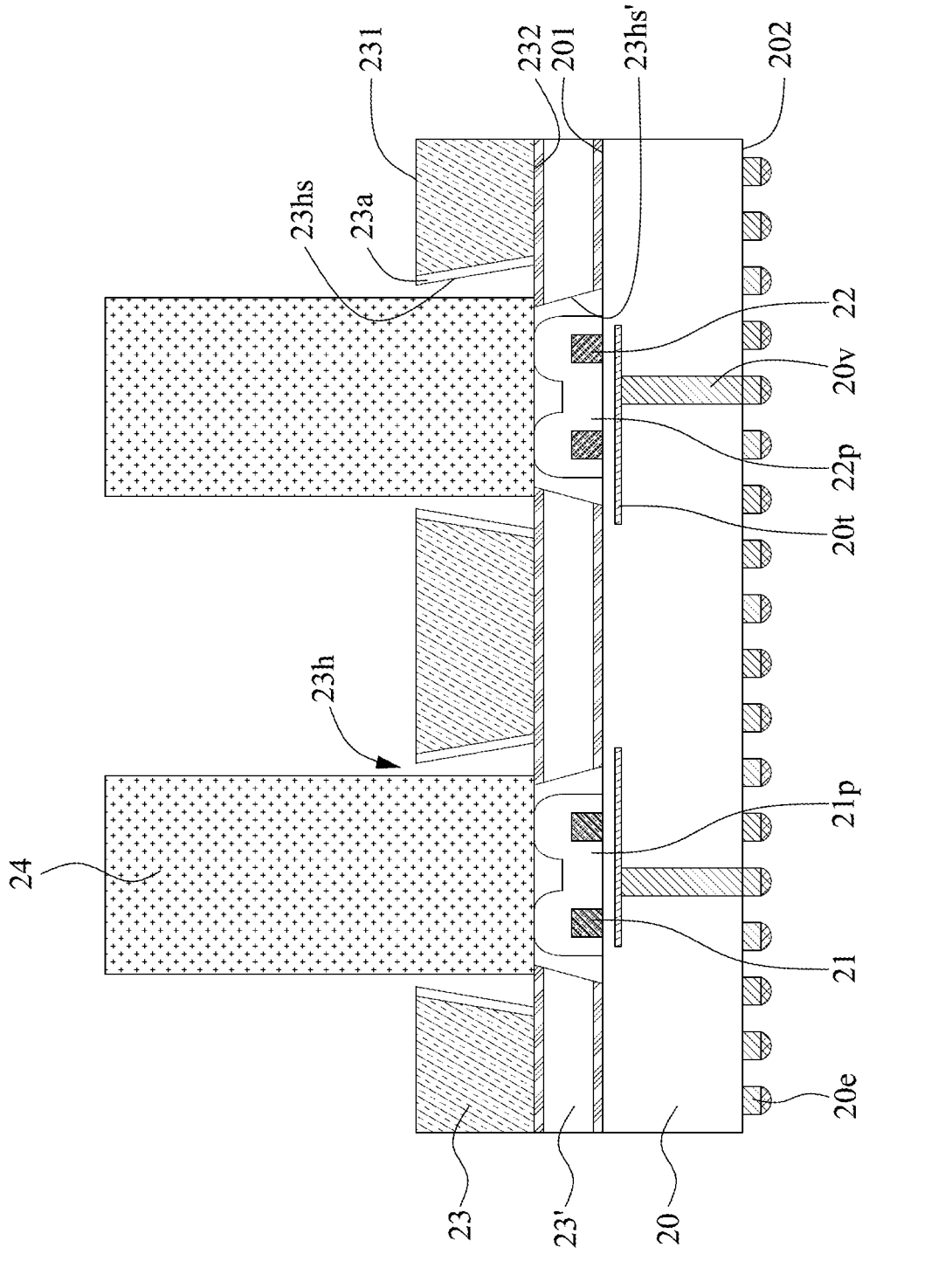
FIG. 2D illustrates a cross-sectional view of a part of an electronic package in accordance with some embodiments of the present disclosure.
Figure 2E:
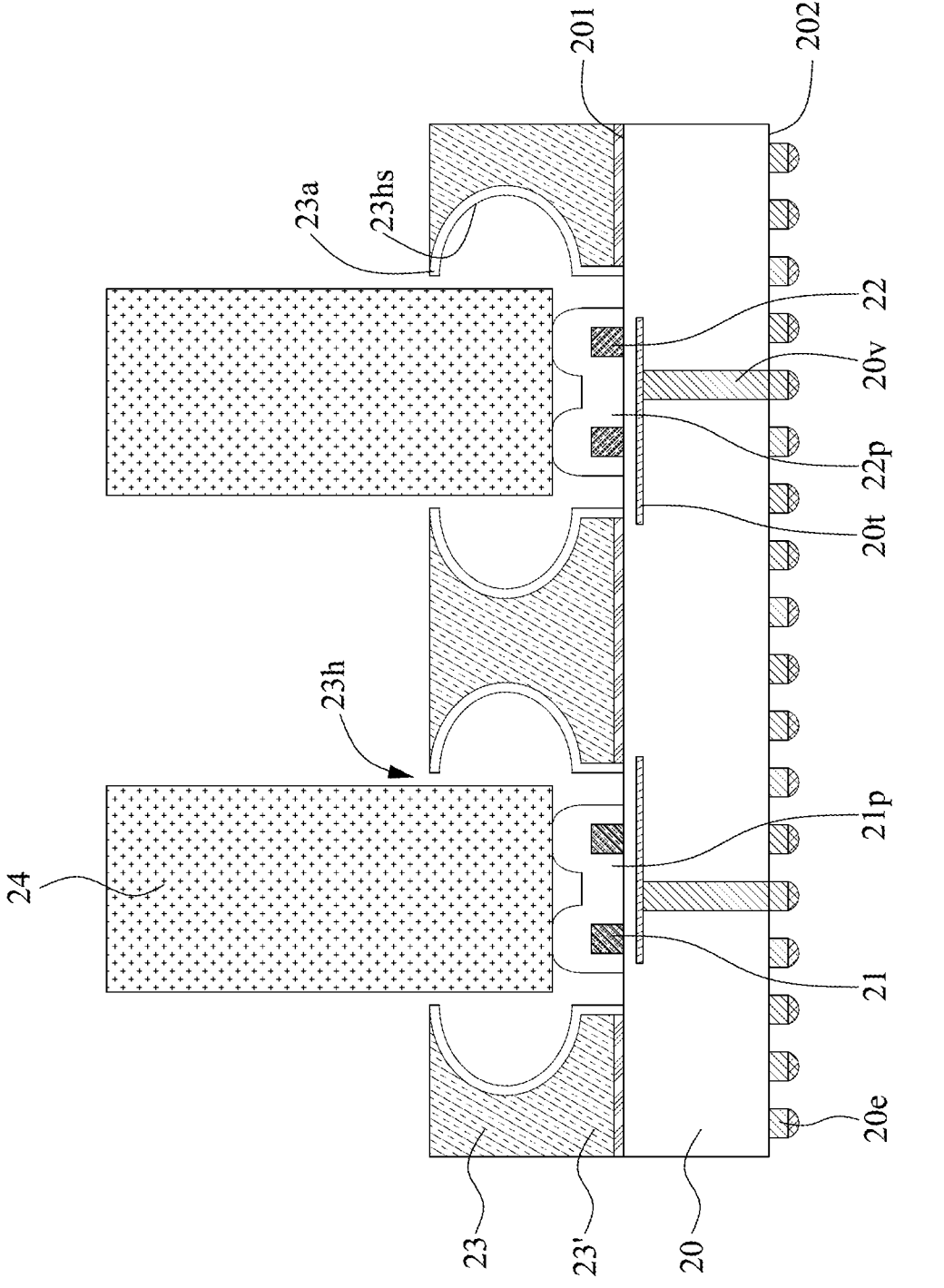
FIG. 2E illustrates a cross-sectional view of a part of an electronic package in accordance with some embodiments of the present disclosure.
Figure 2F:
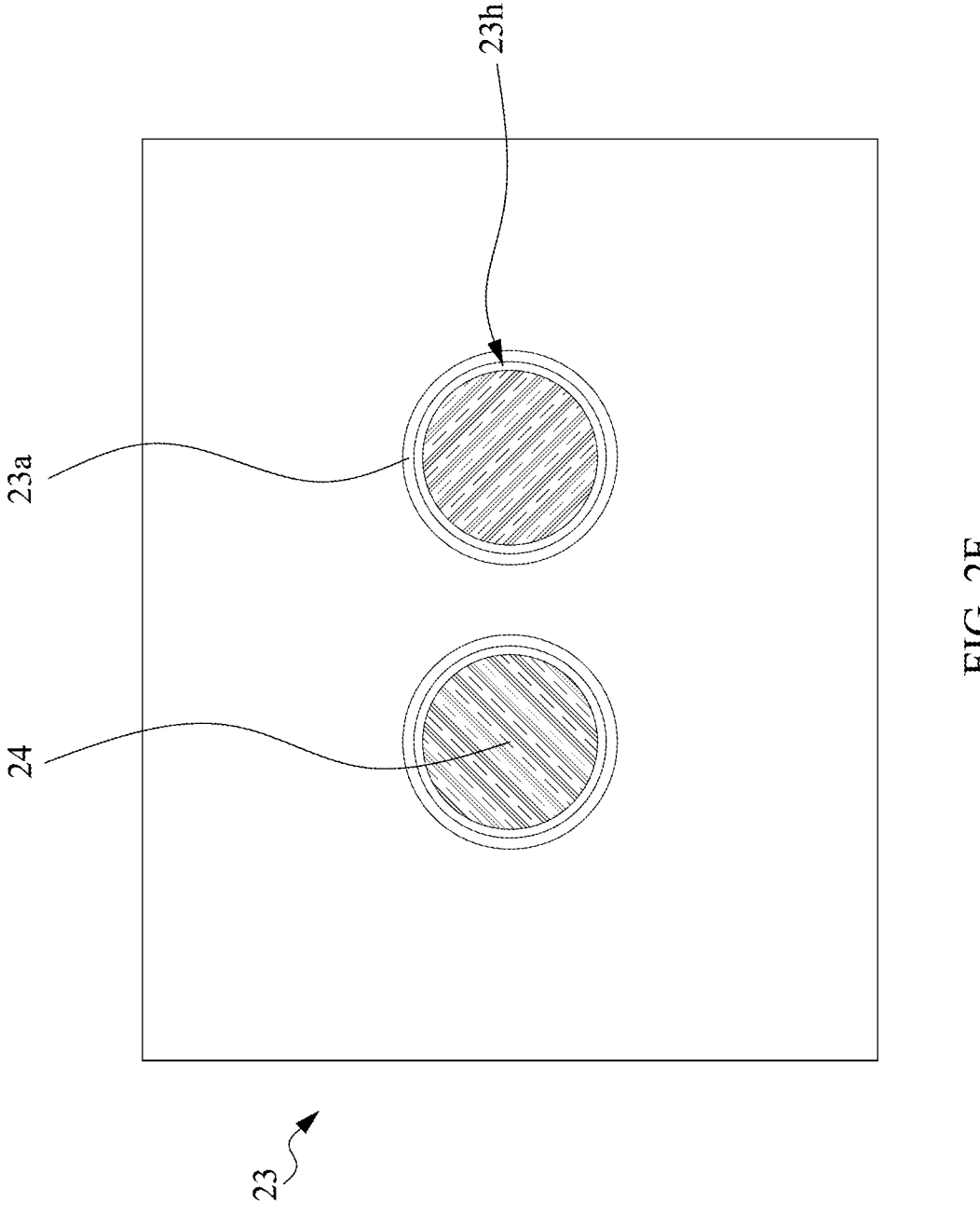
FIG. 2F illustrates a top view of a connector in accordance with some embodiments of the present disclosure.
Figure 2G:
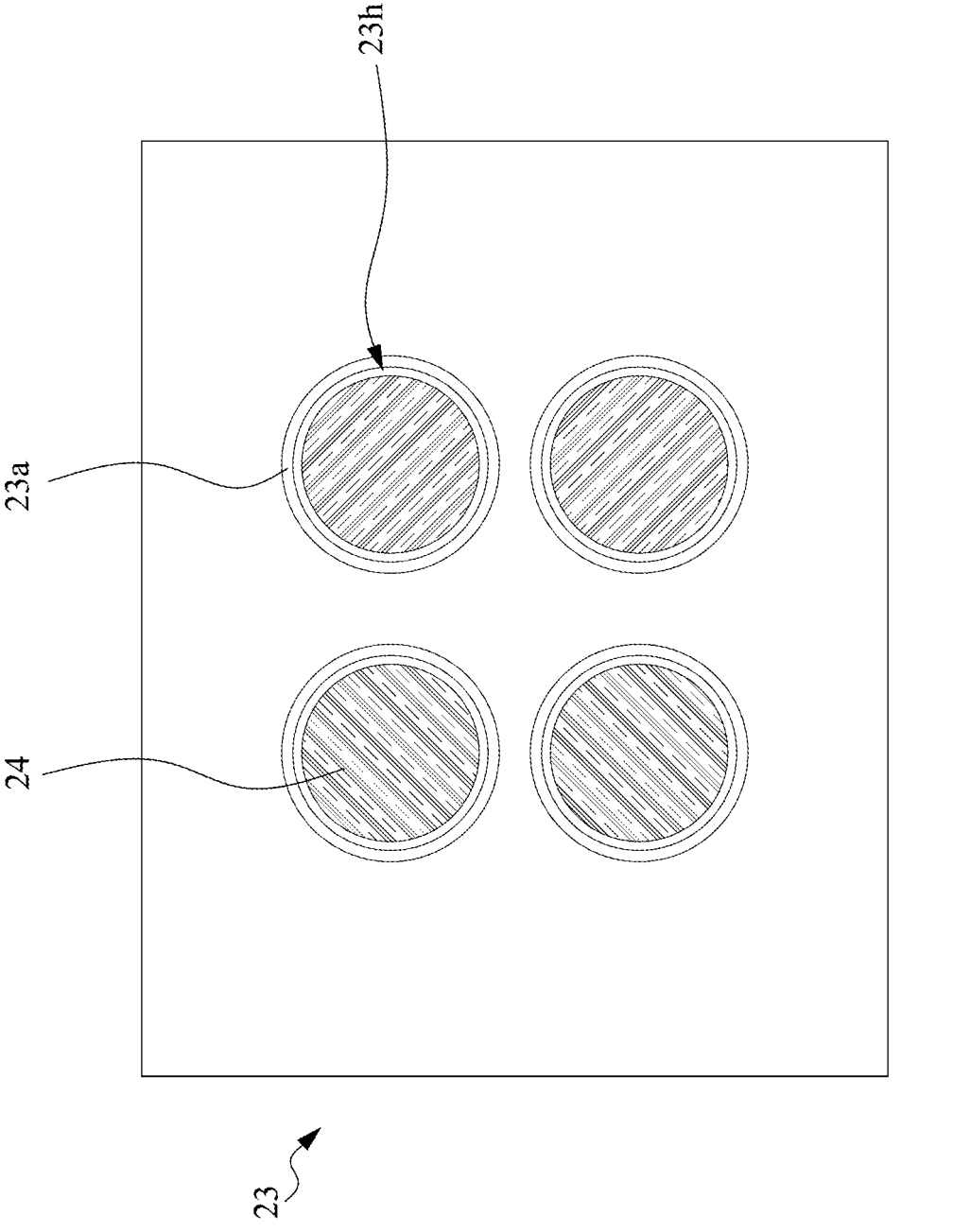
FIG. 2G illustrates a top view of a connector in accordance with some embodiments of the present disclosure.

In some embodiments, as shown in FIGS. 2F and 2G, the light carrying medium 24 may include an array. The array of light carrying mediums 24 may, for example, be an M×N array of light carrying mediums 24. For example, the light carrying mediums 24 may be arranged on a two dimensional (2D) surface (e.g., the surface 201) of the component 20. For example, the light carrying mediums 24 may be arranged on the component 20 along at least two dimensions or directions.

In addition, the opening 23*h* may include an array. The array of openings 23*h* may, for example, be an M×N array of openings 23*h*. The number of openings 23*h* may be equal to the number of light carrying mediums 24. M and N may each be a positive integer. For example, both M and N may be at least 2. For example, each light carrying medium 24 may be plugged into a corresponding one of the openings 23*h* to optically couple to the receiver 21 or the transmitter 22.

The conductive pillar 25 may be disposed on the connector 23 and may be electrically connected with the conductive trace 23*t* thereof. The conductive pillar 25 may be disposed on the overhanging structure (protruding from the surface 203 of the component 20) of the connector 23.

The conductive pillar 25 may be disposed on the carrier 12 in FIG. 1 and electrically connected with the conductive trace 12*t* thereof through an electrical contact 25*e*. In other words, the component 20 may be electrically connected with the carrier 12 in FIG. 1 through the connector 23 and the conductive pillar 25. In other words, the component 20 may be electrically connected with electronic components (such as EIC) incorporated or provided in the electronic component 13 and/or the carrier 12 through the connector 23 and the conductive pillar 25.

The conductive pillar 25 may be adjacent to the surface 203 of the component 20. The conductive pillar 25 may be spaced apart from the surface 203 of the component 20. In some embodiments, the conductive pillar 25 may protrude or extend beyond the surface 202 of the component 20. For example, the conductive pillar 25 may be higher than the component 20. Therefore, when the structure 2 is disposed on the carrier 12 in FIG. 1, the conductive pillar 25 may contact the carrier 12 and the surface 202 of the component 20 may be spaced apart from the carrier 12. The surface 202 of the component 20 may be covered by the encapsulating layer 14. In some embodiments, similar to the dam 20*d*, the conductive pillar 25 may be configured to define or maintain a distance or a gap between the component 20 and the connector 23. For example, the conductive pillar 25 may support or uphold the connector 23. For example, the conductive pillar 25 may keep the gap between the component 20 and the connector 23.

In some embodiments, the conductive pillar 25 may be surrounded, covered, or encapsulated by a dielectric layer 25*d*. The dielectric layer 25*d* may contact a sidewall of the conductive pillar 25. The dielectric layer 25*d* may connect the conductive pillars 25 to one another. For example, the two conductive pillars 25 on the left are connected through the dielectric layer 25*d* on the left. Similarly, the two conductive pillars 25 on the right are connected through the dielectric layer 25*d* on the right.

The dielectric layer 25*d* may include, for example, but is not limited to, one or more organic materials (e.g., phosphoric anhydride (PA), a polyimide (PI), a polybenzoxazole (PBO), an epoxy, and an epoxy-based material), or one or more inorganic materials (e.g., silicon, a glass, a ceramic, and an oxide).

The dielectric layer 25*d* may be surrounded or covered by the encapsulating layer 14. A part of the encapsulating layer 14 may be disposed between the dielectric layer 25*d* and the surface 203 of the component 20.

The receiver 21 may receive optical signals from the light carrying mediums 24 and convert the optical signals into electrical signals. The electrical signals may be transmitted to electronic components (which may be in the electronic component 13 and/or the carrier 12) through the component 20 (such as through the conductive trace 20*t*, the conductive pad 20*p* and the electrical contact 20*e*), the connector 23 (such as through the conductive pad 23*p* and the conductive trace 23*t*), the conductive pillar 25 and the conductive trace 12*t*.

Similarly, electronic signals from the electronic components (which may be in the electronic component 13 and/or the carrier 12) may be transmitted to the transmitter 22 through the conductive trace 12*t*, the conductive pillar 25, the connector 23 (such as through the conductive trace 23*t* and the conductive pad 23*p*) and the component 20 (such as through the electrical contact 20*e*, the conductive pad 20*p* and the conductive trace 20*t*).

According to some embodiments of the present disclosure, the connector 23 can facilitate the alignment between the light carrying mediums 24 and photonic components (such as the receiver 21 and the transmitter 22). In addition, the connector 23 and the conductive pillar 25 can provide electrical connections between the component 20 and the carrier 12. Therefore, no via (such as a through-silicon via (TSV)) in the component 20 is needed. The optical coupling efficiency can be improved and the overall manufacturing cost may be lowered.

Furthermore, the light carrying mediums 24 can be provided on the component 20 over a 2D surface. For example, more rows or columns of light carrying mediums 24 can be provided on the component 20 to support a higher transmission data rate over a wider bandwidth.

FIG. 2B illustrates a cross-sectional view of a part of an electronic package in accordance with some embodiments of the present disclosure. The structure in FIG. 2B is similar to the structure 2 in FIG. 2A except that the coating 23*a* is omitted and the connector 23 includes a sloped or angled corner or edge 23*he*. The sloped edge 23*he* may include a chamfer. The sloped edge 23*he* may be adjacent to the surface 231 of the connector 23. The sloped edge 23*he* may be connected with the internal surface 23*hs* of the opening 23*h*. The sloped edge 23*he* may be inclined with respect to the internal surface 23*hs* of the opening 23*h*.

The sloped edge 23*he* may be configured to facilitate the assembly of the light carrying medium 24. In some embodiments, a width of the opening 23*h* closer to the surface 231 of the connector 23 may be greater than a width of the opening 23*h* closer to the surface 232 of the connector 23. The surface 231 of the connector 23 may face away from the component 20 and the surface 232 of the connector 23 may face the component 20.

FIG. 2C illustrates a cross-sectional view of a part of an electronic package in accordance with some embodiments of the present disclosure. The structure in FIG. 2C is similar to the structure 2 in FIG. 2A except for the following differences.

A connector 23' is disposed between the connector 23 and the component 20. The connector 23' may include a silicon substrate having layers (such as silicon oxide or silicon nitride) on opposite sides of the silicon substrate.

The connector 23' and the connector 23 may collectively define the opening 23*h*. The opening 23*h* may have an internal surface 23*hs* defined by the connector 23 and an internal surface 23*hs'* defined by the connector 23'. The internal surface 23*hs* and the internal surface 23*hs'* may each be substantially perpendicular to the surface 201 of the component 20.

The internal surface 23*hs* of the opening 23*h* defined by the connector 23 may not be aligned with the internal surface 23*hs'* of the opening 23*h* defined by the connector 23'. The internal surface 23*hs* and the internal surface 23*hs'* may be laterally spaced apart from each other. The internal surface 23*hs'* may be closer to the light carrying medium 24 than the internal surface 23*hs*. A width of the opening 23*h* defined by the connector 23 may be greater than a width of the opening 23*h* defined by the connector 23'.

The light carrying medium 24 may be disposed on the connector 23'. For example, the connector 23' may be supported by a surface of the connector 23' (such as an upper surface of the connector 23' facing the connector 23).

The coating 23a may not be disposed on the internal surface 23hs of the opening 23h. For example, the coating 23a may not be disposed on the internal surface 23hs'. There may be any number of layers of the connectors in the structure in FIG. 2C depending on design requirements.

The component 20 may include a conductive via (such as TSV) 20v electrically connected with the conductive trace 20t and the electrical contact 20e on the surface 202. When the component 20 is disposed on the carrier 12 in FIG. 1, the conductive via 20v may be electrically connected with the connector 12v.

The receiver 21 may receive optical signals from the light carrying mediums 24 and convert the optical signals into electrical signals. The electrical signals may be transmitted to electronic components (which may be in the electronic component 13 and/or the carrier 12) through the conductive via 20v. Similarly, electronic signals from the electronic components (which may be in the electronic component 13 and/or the carrier 12) may be transmitted to the transmitter 22 through the conductive via 20v.

FIG. 2D illustrates a cross-sectional view of a part of an electronic package in accordance with some embodiments of the present disclosure. The structure in FIG. 2D is similar to the structure in FIG. 2C except for the following differences.

The internal surface 23hs and the internal surface 23hs' may each be angled or inclined with respect to the surface 201 of the component 20. For example, the width of the opening 23h may be enlarged from the surface 231 to the surface 232. For example, the width of the opening 23h defined by the connector 23' may be enlarged away from the light carrying medium 24. For example, the width of the opening 23h defined by the connector 23' may be decreased toward the light carrying medium 24.

FIG. 2E illustrates a cross-sectional view of a part of an electronic package in accordance with some embodiments of the present disclosure. The structure in FIG. 2E is similar to the structure in FIG. 2C except for the following differences.

The internal surface 23hs of the opening 23h may be curved. For example, the internal surface 23hs of the opening 23h may have an arc profile or contour from a cross-sectional view. The profile or contour of the opening 23h may be adjusted based on designed requirements and is not limited thereto. The structure 2 in FIG. 1 may be replaced with the structures in FIGS. 2B, 2C, 2D and 2E.

FIGS. 2F and 2G illustrate top views of the connector 23 in accordance with some embodiments of the present disclosure. In some embodiments, FIGS. 2F and 2G may illustrate top views of the connector 23 in FIG. 1A taken along the line AA'. As described, the array of the light carrying mediums 24 may, for example, be an M×N array of light carrying mediums 24. In some embodiments, more rows or columns of light carrying mediums 24 can be provided to support higher transmission data rate over a wider bandwidth. In some embodiments, the light carrying mediums 24 may be located randomly.

Figure 2H:
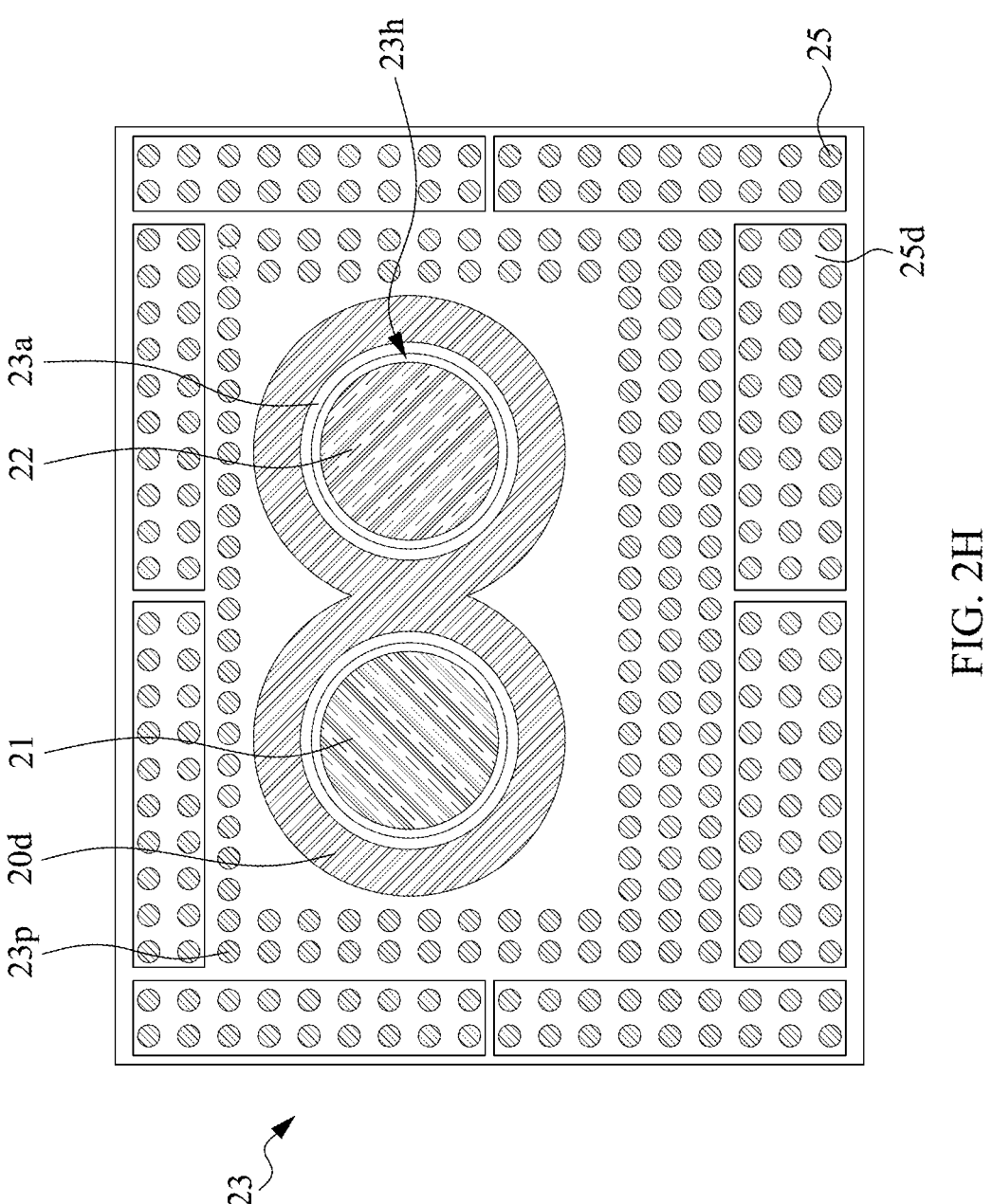
FIG. 2H illustrates a bottom view of a connector in accordance with some embodiments of the present disclosure.

FIG. 2H illustrates a bottom view of the connector 23 in accordance with some embodiments of the present disclosure. In some embodiments, FIG. 2H may illustrate a bottom view of the connector 23 in FIG. 1A taken along the line BB'.

The coating 23a may be disposed on the internal surfaces of the openings 23h. The dam 20d may be adjacent to the opening 23h. From the bottom view, the coating 23a may be surrounded by the dam 20d.

A plurality of conductive pillars 25 may be disposed on the periphery of the connector 23. The conductive pillars 25 may surround the component 20 shown in FIG. 2A. For example, the conductive pillars 25 may be disposed around the surface 203 of the component 20 shown in FIG. 2A. For example, the conductive pillars 25 may be arranged along the surface 203 of the component 20 shown in FIG. 2A.

A plurality of dielectric layers 25d may be disposed on the periphery of the connector 23. The dielectric layers 25d may each include a rectangular shape and may support a plurality of conductive pillars 25. For example, a first dielectric layer may support a first set of conductive pillars and a second dielectric layer may support a second set of conductive pillars. The first dielectric layer and the second dielectric layer are disposed on the periphery of the connector 23. The first dielectric layer and the second dielectric layer are spaced apart from each other. The first dielectric layer and the second dielectric layer may be physically separated by the encapsulating layer 14 in FIG. 2A.

For example, as shown in FIG. 5F-1, a singulation may be performed to separate out individual dielectric layers 25d. The singulation may be performed, for example, by using a dicing saw, laser or other appropriate cutting techniques.

Figure 2I:
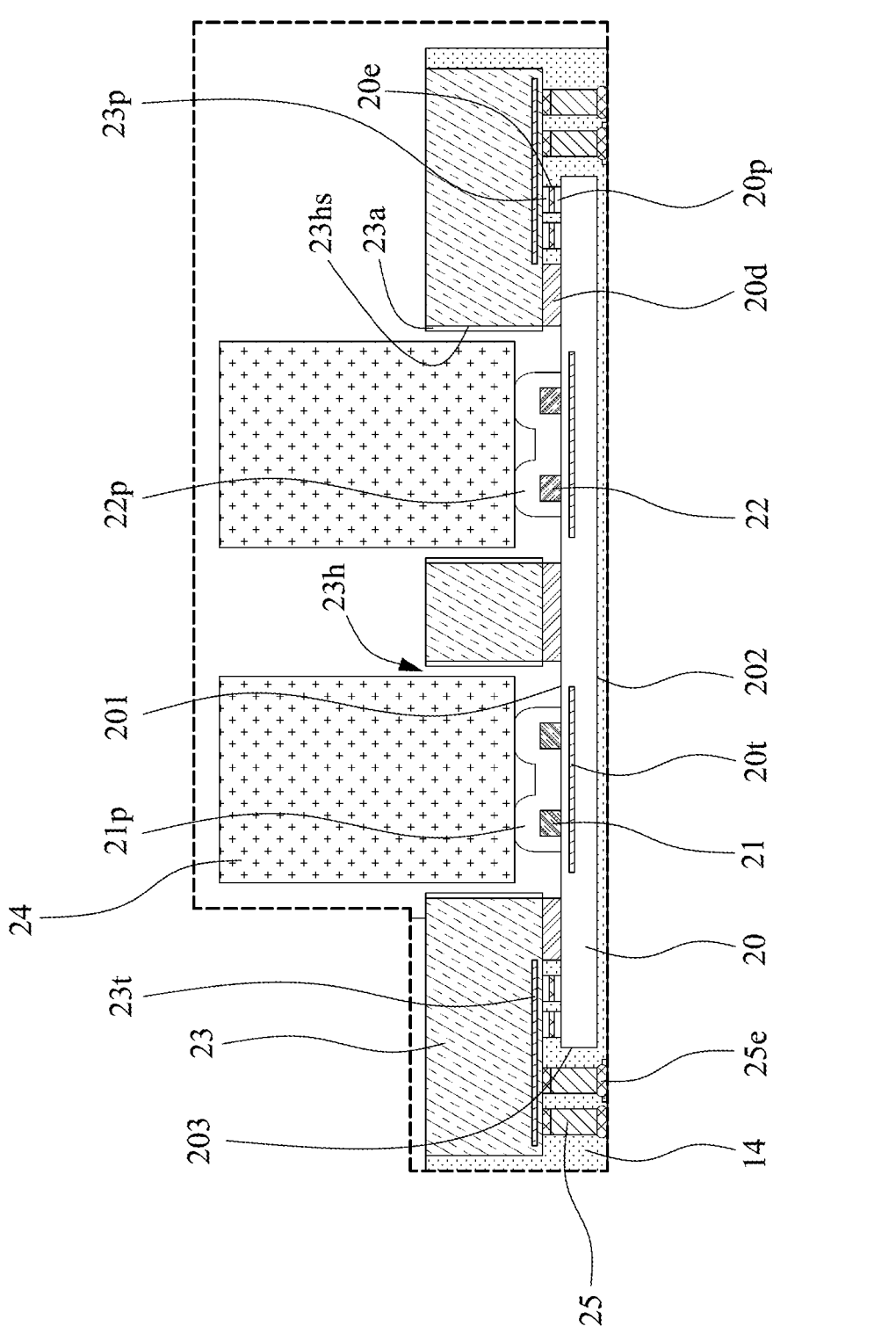
FIG. 2I illustrates a cross-sectional view of a part of an electronic package in accordance with some embodiments of the present disclosure.

FIG. 2I illustrates a cross-sectional view of a part of an electronic package in accordance with some embodiments of the present disclosure. The structure in FIG. 2I is similar to the structure 2 in FIG. 2A except that the dielectric layers 25d are omitted. The conductive pillar 25 may be surrounded or covered by the encapsulating layer 14. The encapsulating layer 14 may contact a sidewall of the conductive pillar 25. The encapsulating layer 14 may connect the conductive pillars 25 to one another.

Figure 2J:
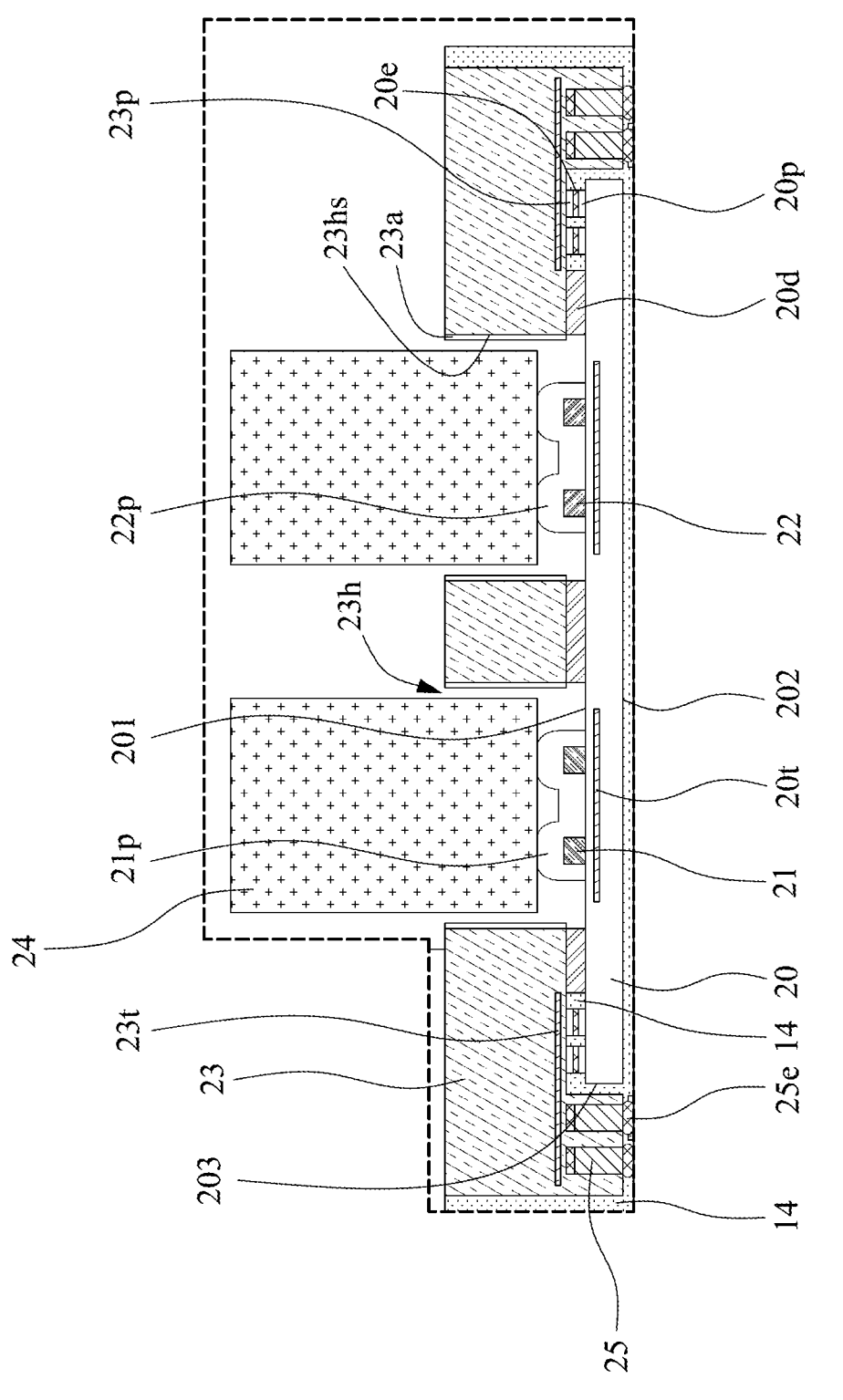
FIG. 2J illustrates a cross-sectional view of a part of an electronic package in accordance with some embodiments of the present disclosure.

FIG. 2J illustrates a cross-sectional view of a part of an electronic package in accordance with some embodiments of the present disclosure. The structure in FIG. 2I is similar to the structure 2 in FIG. 2A except that the dielectric layers 25d are omitted and that the conductive pillar 25 is surrounded or covered by the connector 23. The connector 23 may have a portion (such as a protruding portion or an extending portion) extending along the surface 203 of the component 20 and extending from the surface 201 to the surface 202. The portion may be on the periphery of the connector 23. The conductive pillar 25 may be surrounded in the portion and extend along with the portion. The connector 23 may define a cavity or an opening for accommodating the component 20.

Figure 3A:
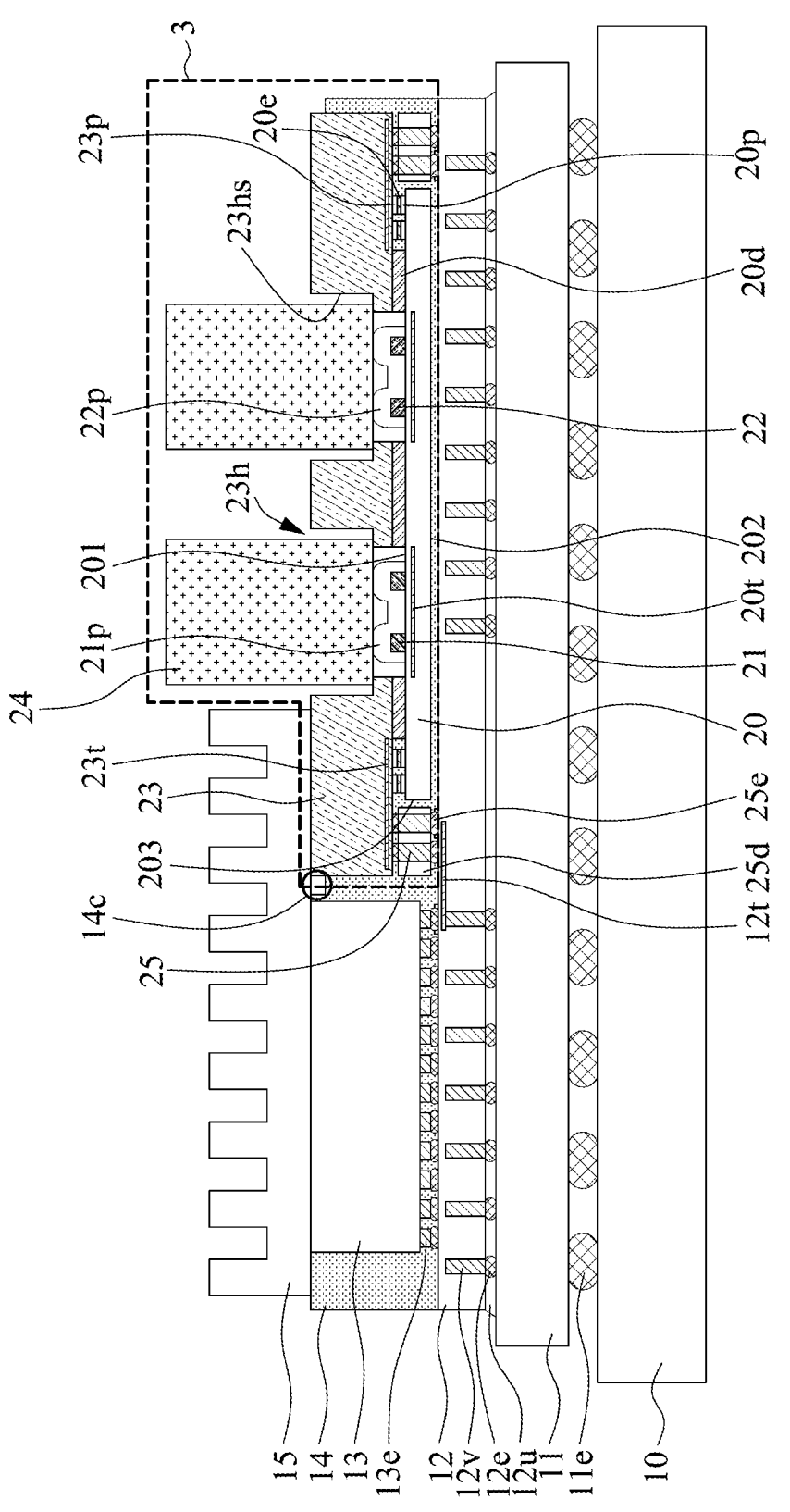
FIG. 3A illustrates a cross-sectional view of an electronic package in accordance with some embodiments of the present disclosure.

FIG. 3A illustrates a cross-sectional view of an electronic package 1' in accordance with some embodiments of the present disclosure. The electronic package 1' in FIG. 3A is similar to the electronic package 1 in FIG. 1 except for the structure 3.

The coating 23a may be omitted in the structure 3. In some embodiments, as shown in FIG. 6G, an optical test may be conducted after the component 20 is disposed on the connector 23. Since the temporary carrier 60 is transparent to light radiated by the transmitter 22 or by an external light source, no AR coating is needed.

The internal surface 23hs of the opening 23h defines a stepped structure. The light carrying medium 24 may be disposed on the stepped structure of connector 23. The light carrying medium 24 may contact the connector 23 of connector 23. The light carrying medium 24 may be supported by the stepped structure of connector 23.

A cavity 14c may be formed in the encapsulating layer 14. A surface (such as a lateral surface) of the connector 23 may be exposed from the cavity 14c. A surface of the heat dissipating element 15 may be exposed from the cavity 14c. The cavity 14c may be recessed from a top surface of the encapsulating layer 14. The cavity 14c may be recessed from a surface of the connector 23 that facing away from the component 20.

Figure 3B:
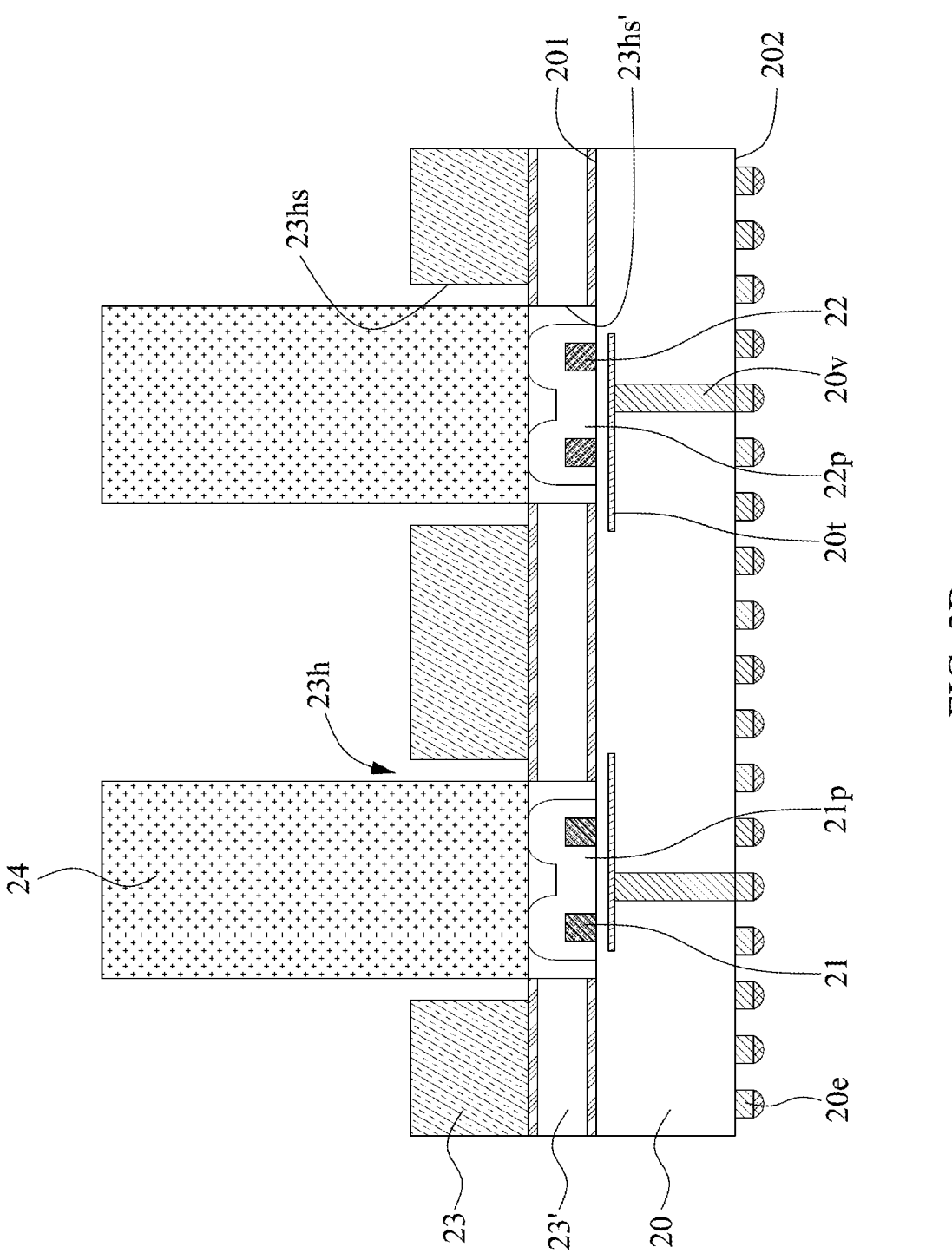
FIG. 3B illustrates a cross-sectional view of a part of an electronic package in accordance with some embodiments of the present disclosure.
Figure 3C:
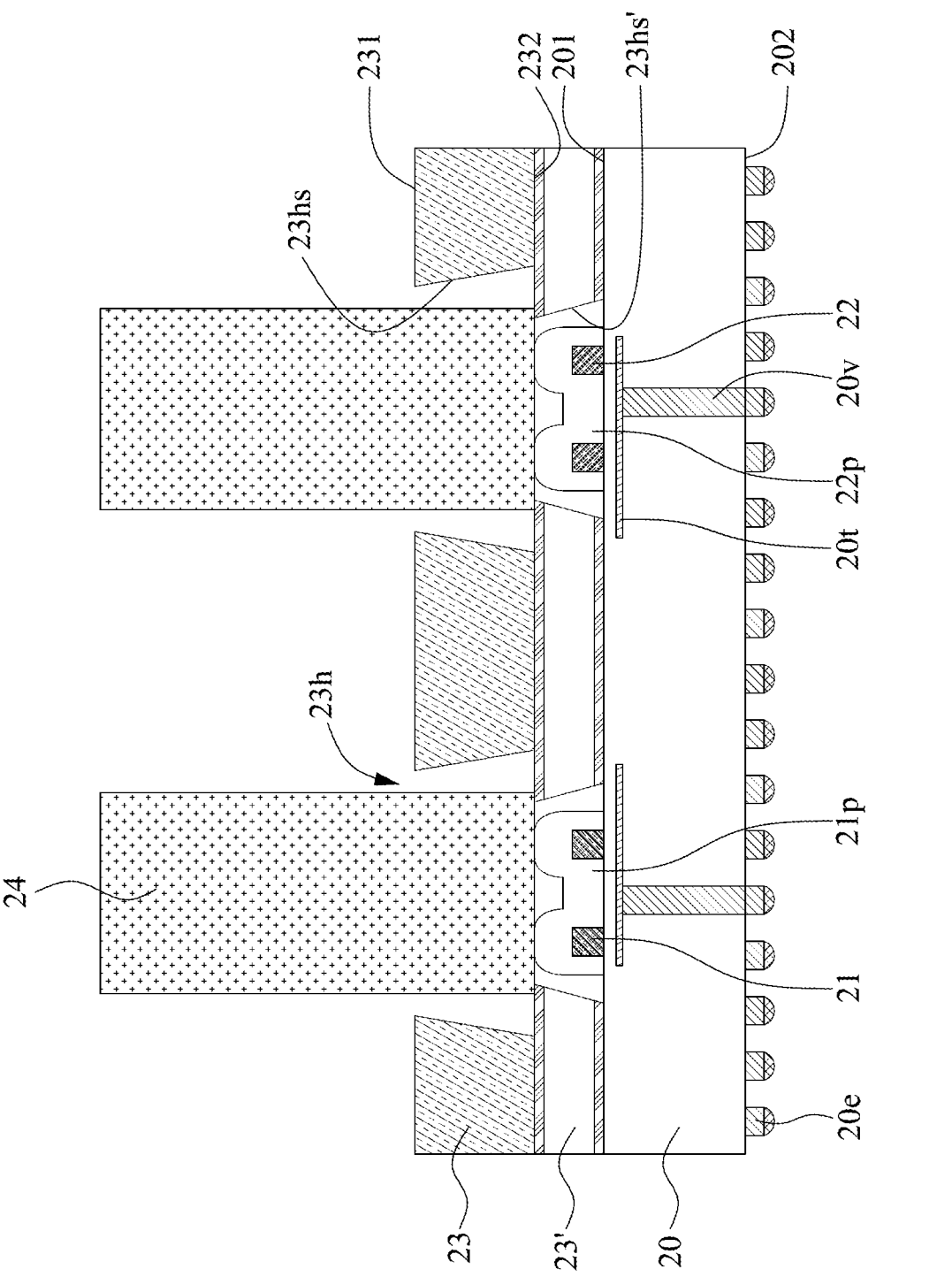
FIG. 3C illustrates a cross-sectional view of a part of an electronic package in accordance with some embodiments of the present disclosure.
Figure 3D:
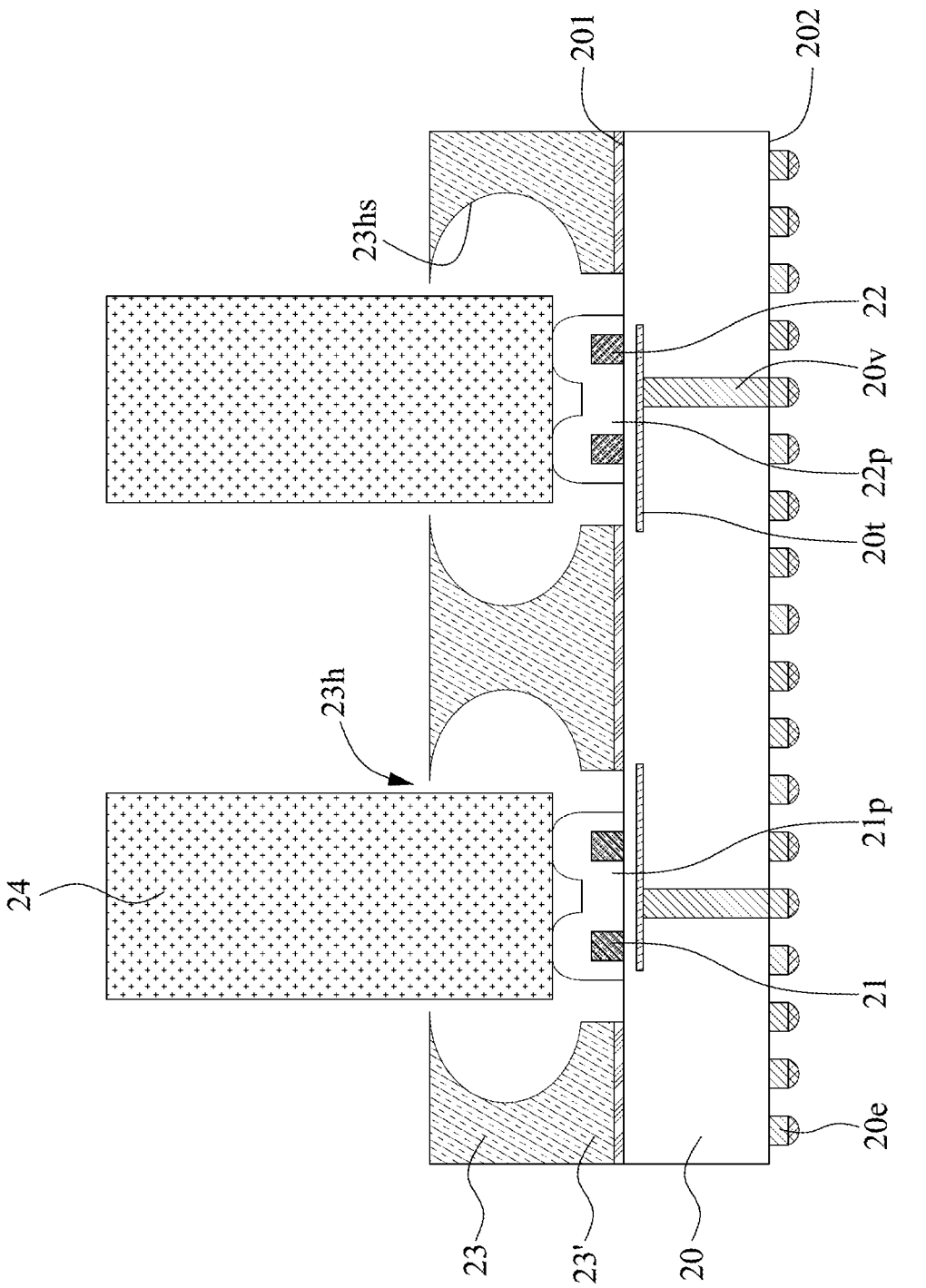
FIG. 3D illustrates a cross-sectional view of a part of an electronic package in accordance with some embodiments of the present disclosure.

FIGS. 3B, 3C and 3D illustrate cross-sectional views of a part of an electronic package in accordance with some embodiments of the present disclosure. The structure in FIGS. 3B, 3C and 3D is similar to the structure in FIGS. 2C, 2D and 2E except that the coating 23a is omitted. The structure 3 in FIG. 3A may be replaced with the structures in FIGS. 3B, 3C and 3D.

Figure 4A:
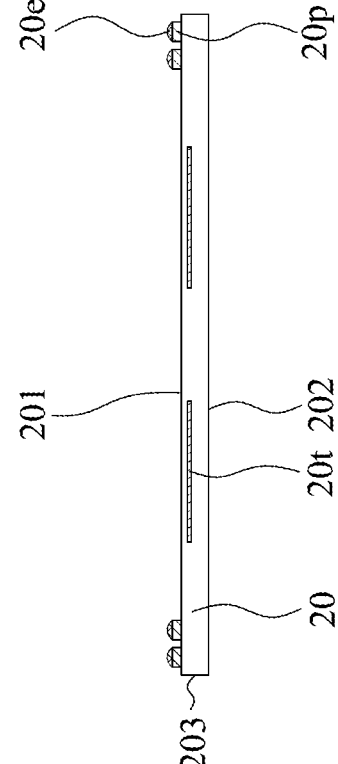
FIG. 4A, FIG. 4B and FIG. 4C illustrate cross-sectional views in one or more stages of a method of manufacturing a part of an electronic package in accordance with an embodiment of the present disclosure.
Figure 4B:
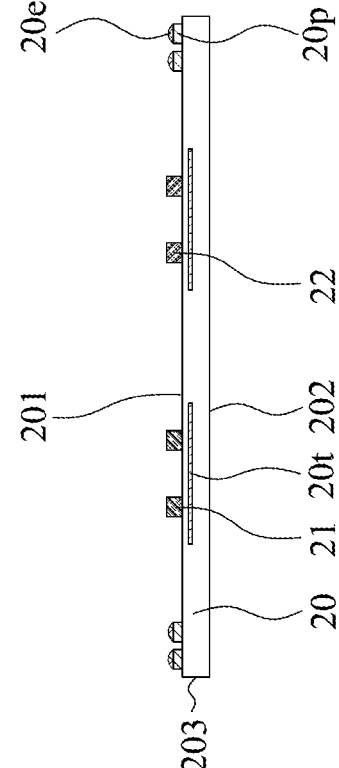
Figure 4C:
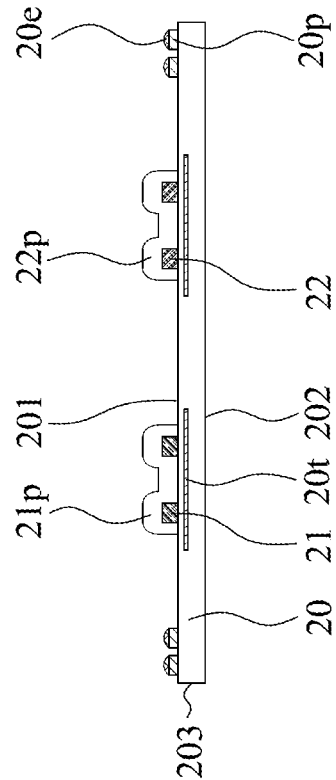

FIG. 4A, FIG. 4B and FIG. 4C illustrate cross-sectional views in one or more stages of a method of manufacturing a part of an electronic package in accordance with an embodiment of the present disclosure.

Referring to FIG. 4A, the component 20 may be provided. The component 20 may have the conductive trace 20t. The conductive pad 20p and the electrical contact 20e may be disposed on the surface 201 of the component 20.

Referring to FIG. 4B, the receiver 21 and the transmitter 22 may be attached on the surface 201 of the component 20.

Referring to FIG. 4C, the protection layers 21p and 22p may be disposed on the surface 201 of the component 20 to cover the receiver 21 and the transmitter 22. In some embodiments, the protection layers 21p and 22p may be formed by a polymer imprint operation.

FIG. 5A, FIG. 5B, FIG. 5C, FIG. 5D, FIG. 5E, FIG. 5F, FIG. 5F-1, FIG. 5G, FIG. 5H, FIG. 5I, FIG. 5J, FIG. 5K, FIG. 5L, FIG. 5M and FIG. 5N illustrate cross-sectional views in one or more stages of a method of manufacturing an electronic package in accordance with an embodiment of the present disclosure. At least some of these figures have been simplified to better understand the aspects of the present disclosure. In some embodiments, the electronic package 1 may be manufactured through the operations described with respect to FIG. 4A, FIG. 4B, FIG. 4C, FIG. 5A, FIG. 5B, FIG. 5C, FIG. 5D, FIG. 5E, FIG. 5F, FIG. 5F-1, FIG. 5G, FIG. 5H, FIG. 5I, FIG. 5J, FIG. 5K, FIG. 5L, FIG. 5M and FIG. 5N.

Referring to FIG. 5A, the connector 23 may be provided. The connector 23 may include the conductive trace 23t.

Referring to FIG. 5B, the conductive pad 23p may be disposed on the connector 23. In some embodiments, a diameter of the conductive pad 23p may be about 25 μm. In some embodiments, a pitch of the conductive pads 23p may range from about 45 μm to about 55 μm.

Referring to FIG. 5C, the dam 20d may be disposed on the connector 23. The dam may be patterned to define the location of the opening 23h to be formed.

Referring to FIG. 5D, the opening 23h may be formed by photolithography and anisotropic etching (e.g., DRIE), or may be formed by a laser machining operation. A part of the dam 20d may also be removed, forming a substantially coplanar surface. In some embodiments, a depth of the opening 23h may range from about 0.5 nm to about 0.6 nm.

Referring to FIG. 5E, the coating 23a may be applied or formed on surfaces of the connector 23. In some embodiments, the coating 23a may be formed by a chemical vapor deposition (CVD) operation or a spin coating operation.

Referring to FIG. 5F, the structure obtained through FIG. 4A, FIG. 4B and FIG. 4C may be disposed on the connector 23. The connector 23 may be electrically connected with the component 20 through the conductive pad 20p, the conductive pad 23p and the electrical contact 20e. The receiver 21 and the transmitter 22 may each be aligned with one opening 23h. The dam 20d may be configured to define a distance or a gap between the component 20 and the connector 23.

In addition, the conductive pillar 25 may be disposed on the connector 23 and may be electrically connected with the conductive trace 23t thereof. The conductive pillar 25 may be spaced apart from the surface 203 of the component 20.

Referring to FIG. 5F-1, the dielectric layer 25d and a plurality of conductive pillars 25 may be attached on a carrier 50 through an adhesive layer 50a. A singulation may be performed to separate out individual dielectric layers 25d. The singulation may be performed, for example, by using a dicing saw, laser or other appropriate cutting techniques. Electrical contacts may be disposed on each of the conductive pillars 25.

Referring to FIG. 5G, the encapsulating layer 14 may be disposed on the connector 23 to cover the component 20 and the conductive pillar 25. The encapsulating layer 14 may also covered the conductive pad 20p, the conductive pad 23p, the electrical contact 20e and the electrical contacts on the conductive pillar 25. In some embodiments, the encapsulating layer 14 may be formed by a molding technique, such as transfer molding or compression molding. The dam 20d may be configured to prevent the encapsulating layer 14 from flowing into the opening 23h.

In addition, a grinding or polishing operation may be performed to remove a portion of the encapsulating layer 14. The grinding operation may be an abrasive machining process that uses a grinding wheel or grinder as the cutting tool. After the grinding operation, the conductive pillar 25 and the surface 202 of the component 20 may be exposed.

Referring to FIG. 5H, the electrical contact 25e may be disposed on the exposed surface of the conductive pillar 25. In some embodiments, a singulation may be performed to separate out individual connectors 23, each of which is provided with one component 20. The singulation may be performed, for example, by using a dicing saw, laser or other appropriate cutting techniques.

In some embodiments, an optical test may be conducted after the component 20 is disposed on the connector 23. In some embodiments wherein the connector 23 does not allow light (such as in the spectrum of about 1200 nanometers (nm) to about 1800 nm) radiated by the transmitter 22 or by an external light source to pass through, the coating 23a may help increase throughput and reduce hazards caused by back-reflections.

Figure 5I:
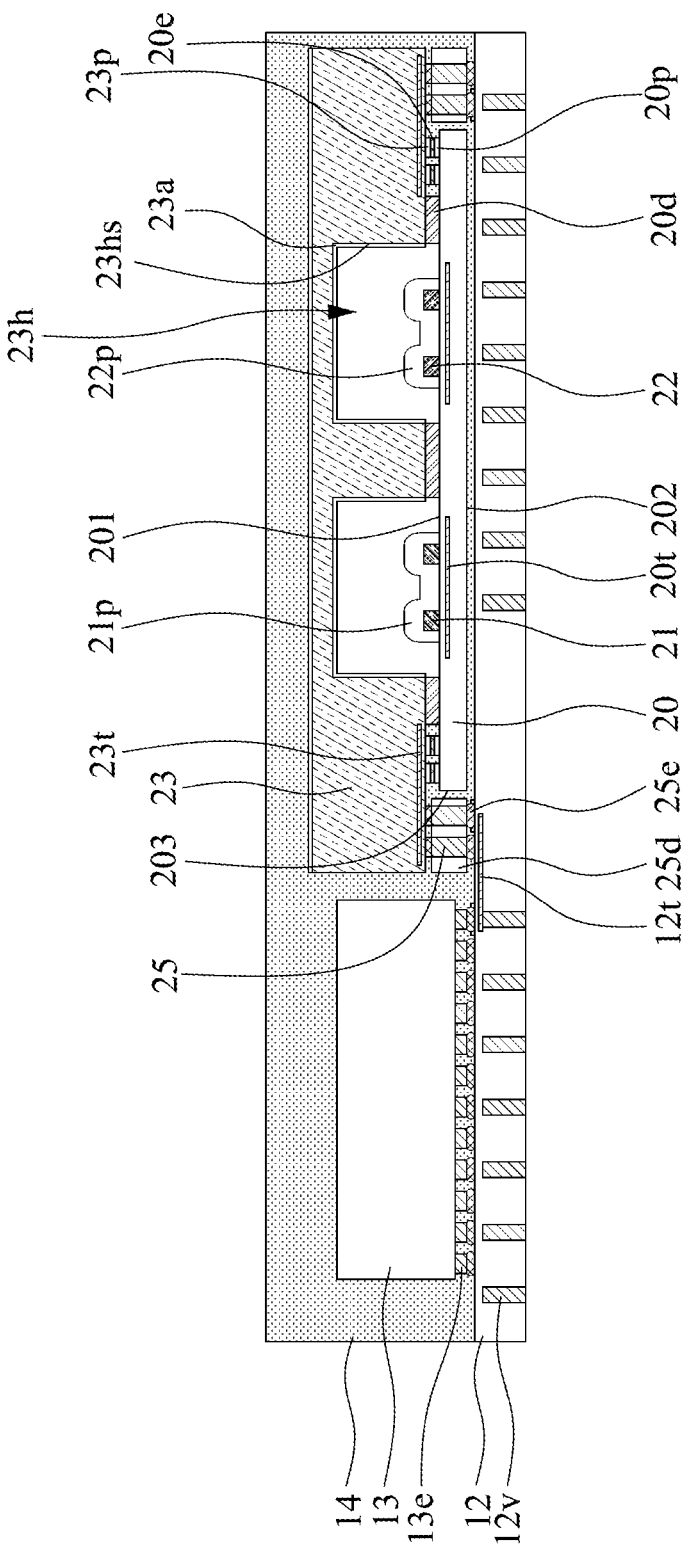

Referring to FIG. 5I, the connector 23 and the electronic component 13 may be disposed on the carrier 12. The connector 23 may be electrically connected with the carrier 12 through the conductive pillar 25. The electronic component 13 may be electrically connected with the carrier 12 through the electrical contact 13e. The encapsulating layer 14 may be disposed on the carrier 12 to cover the connector 23 and the electronic component 13.

Figure 5J:
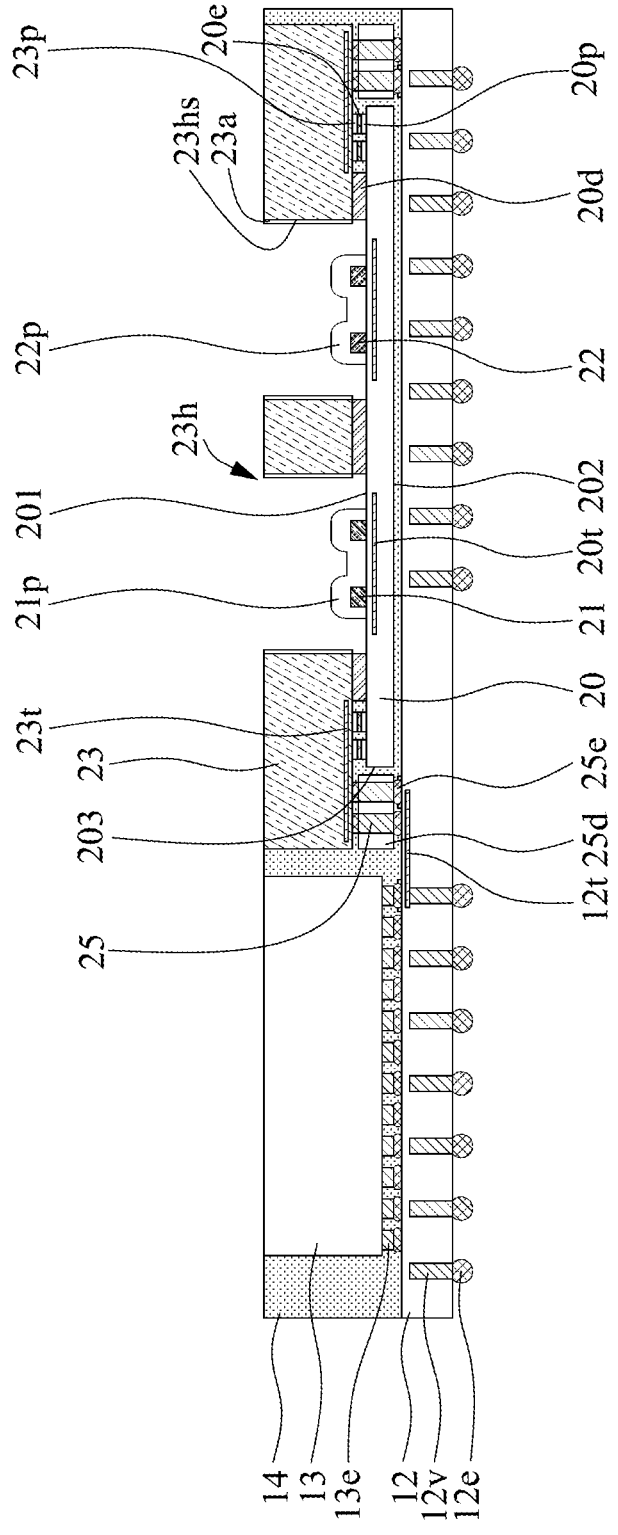

Referring to FIG. 5J, a grinding or polishing operation may be performed to remove a portion of the encapsulating layer 14 and a portion of the connector 23. The grinding operation may be an abrasive machining process that uses a grinding wheel or grinder as the cutting tool. After the grinding operation, the receiver 21 and the transmitter 22 may each be exposed through one opening 23h. The electrical contact 12e may be disposed on each of the connectors 12v.

Figure 5K:
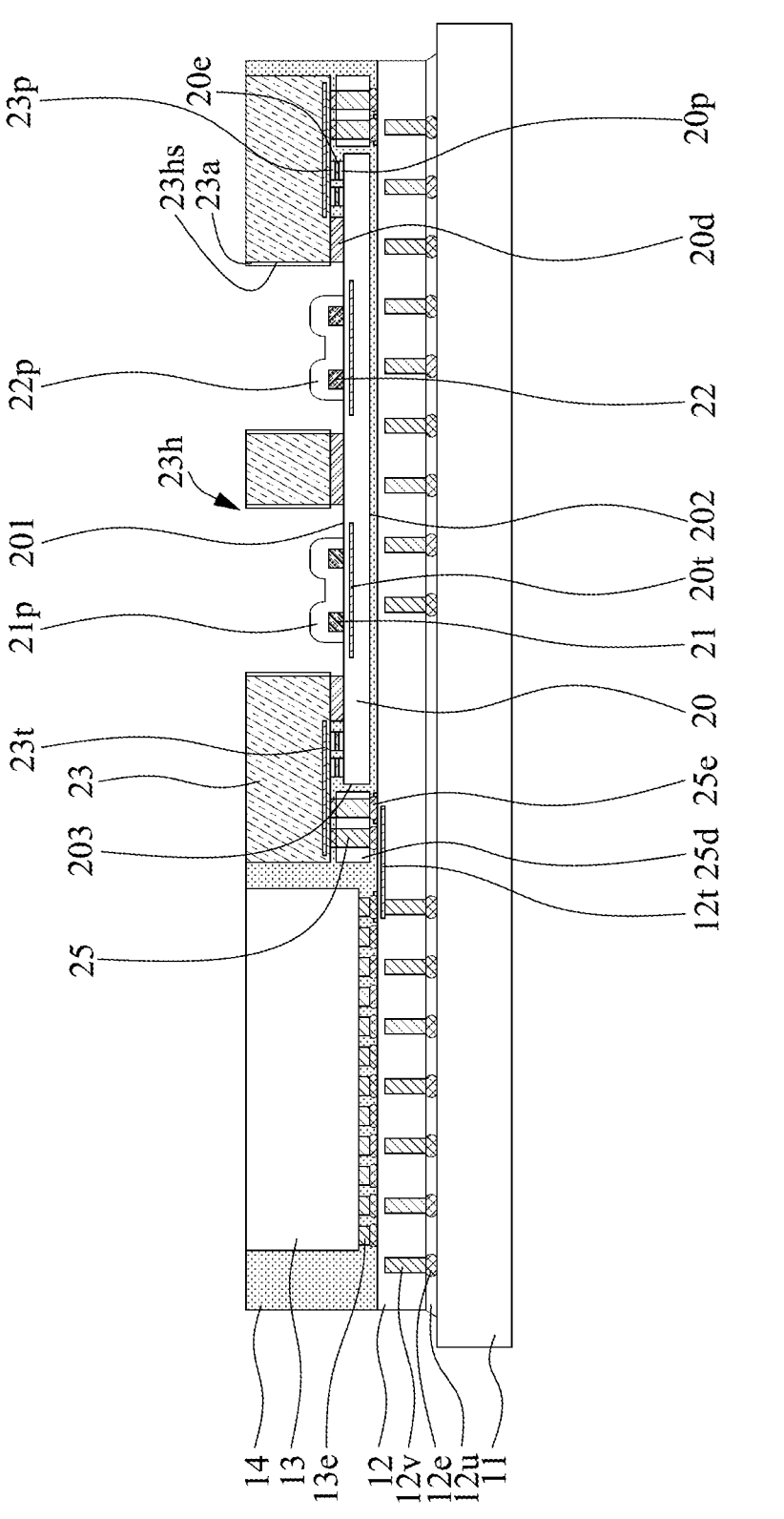

Referring to FIG. 5K, the carrier 12 may be disposed on the carrier 11 and may be electrically connected with the carrier 11 through the electrical contact 12e. In some embodiments, the underfill 12u may be disposed between the carrier 12 and the carrier 11. The underfill 12u may cover, surround or encapsulate the electrical contact 12e.

Figure 5L:
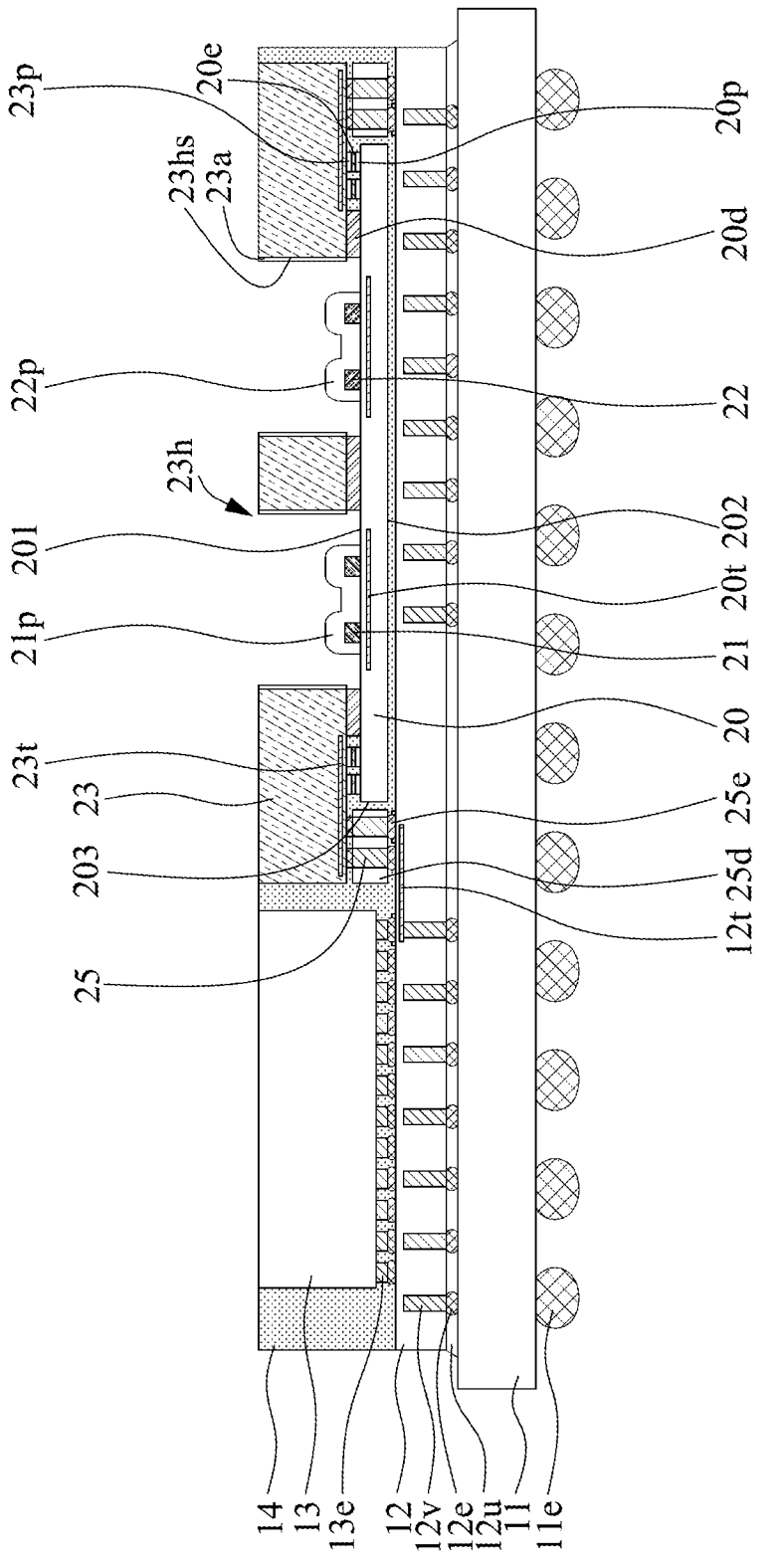

Referring to FIG. 5L, the electrical contact 11*e* may be disposed on the carrier 11.

Figure 5M:
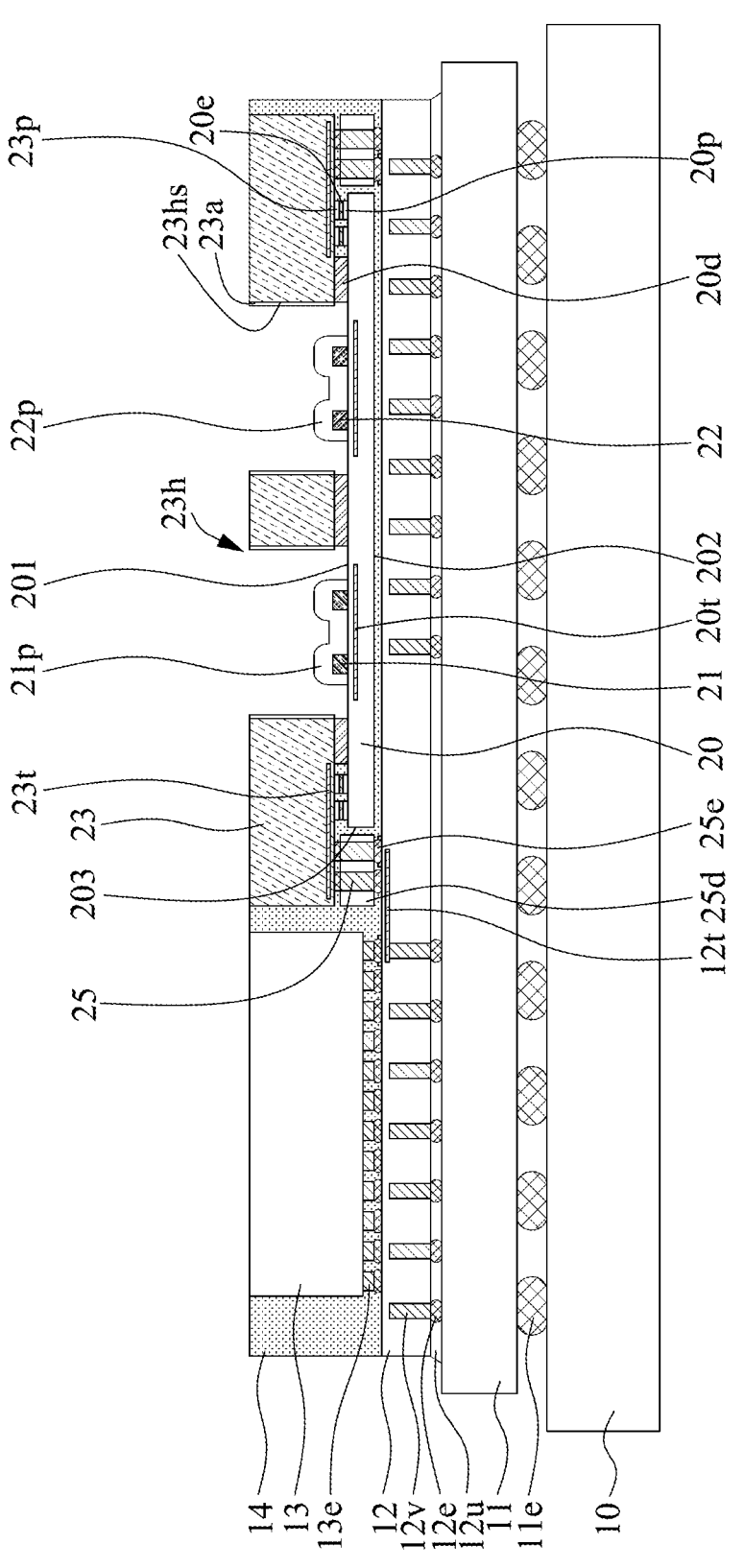

Referring to FIG. 5M, the carrier 11 may be disposed on the carrier 10 and may be electrically connected with the carrier 10 through the electrical contact 11*e*.

Figure 5N:
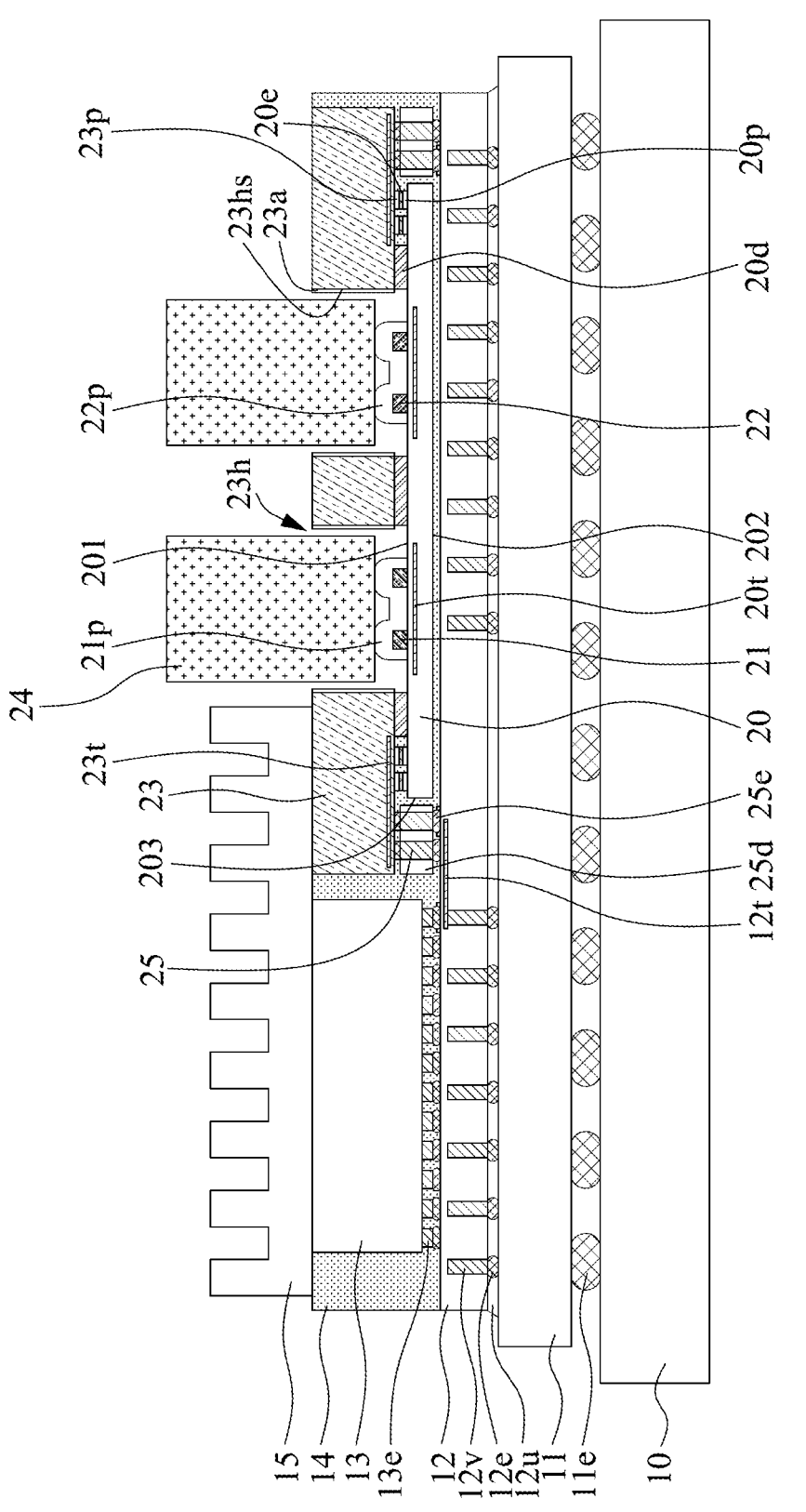

Referring to FIG. 5N, the light carrying medium 24 may be plugged into the opening 23*h* to optically couple to the receiver 21 or the transmitter 22. The heat dissipating element 15 may be disposed on the connector 23 and the electronic component 13.

FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L and FIG. 6M illustrate cross-sectional views in one or more stages of a method of manufacturing an electronic package in accordance with an embodiment of the present disclosure. At least some of these figures have been simplified to better understand the aspects of the present disclosure. In some embodiments, the electronic package 1' may be manufactured through the operations described with respect to FIG. 4A, FIG. 4B, FIG. 4C, FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L and FIG. 6M.

Figure 6A:
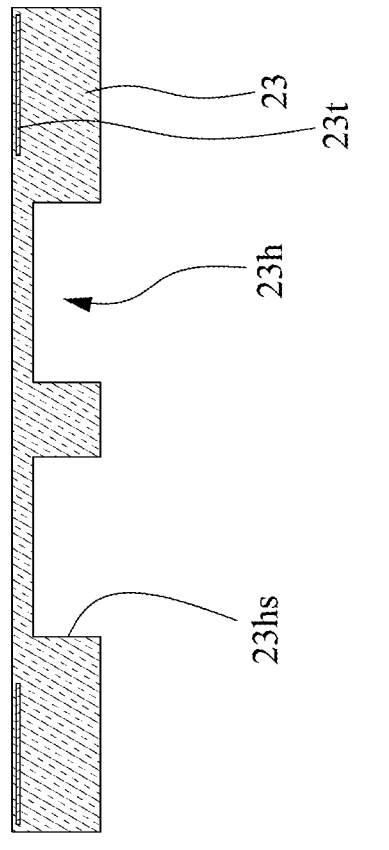
FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L and FIG. 6M illustrate cross-sectional views in one or more stages of a method of manufacturing an electronic package in accordance with an embodiment of the present disclosure.

The operation in FIG. 6A may be subsequent to the operation in FIG. 5A. In FIG. 6A, the opening 23*h* may be formed by photolithography and anisotropic etching (e.g., DRIE), or may be formed by a laser machining operation. In some embodiments, a depth of the opening 23*h* may range from about 0.5 nm to about 0.6 nm.

Figure 6B:
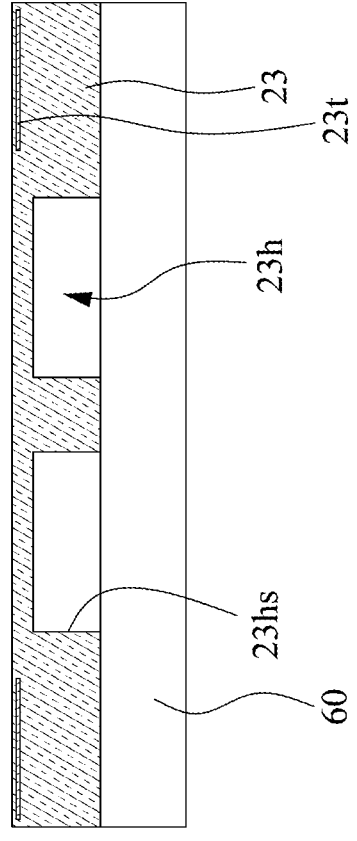

Referring to FIG. 6B, the connector 23 may be disposed on a temporary carrier 60 through an adhesive layer, such as a UV released adhesive later. The temporary carrier 60 may include a glass carrier. In some embodiments, the temporary carrier 60 is transparent to light radiated by the transmitter 22 or by an external light source. Therefore, no AR coating is needed.

Figure 6C:
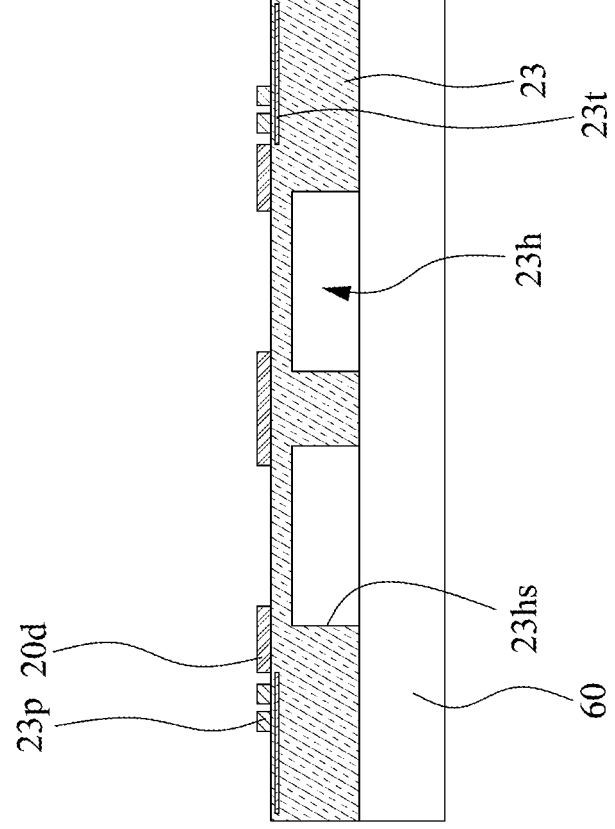

Referring to FIG. 6C, the conductive pad 23*p* and the dam 20*d* may be disposed on the connector 23. In some embodiments, a diameter of the conductive pad 23*p* may be about 25 μm. In some embodiments, a pitch of the conductive pads 23*p* may range from about 45 μm to about 55 μm. The dam 20*d* may be patterned to define the location not to be removed in the following operation.

Figure 6D:
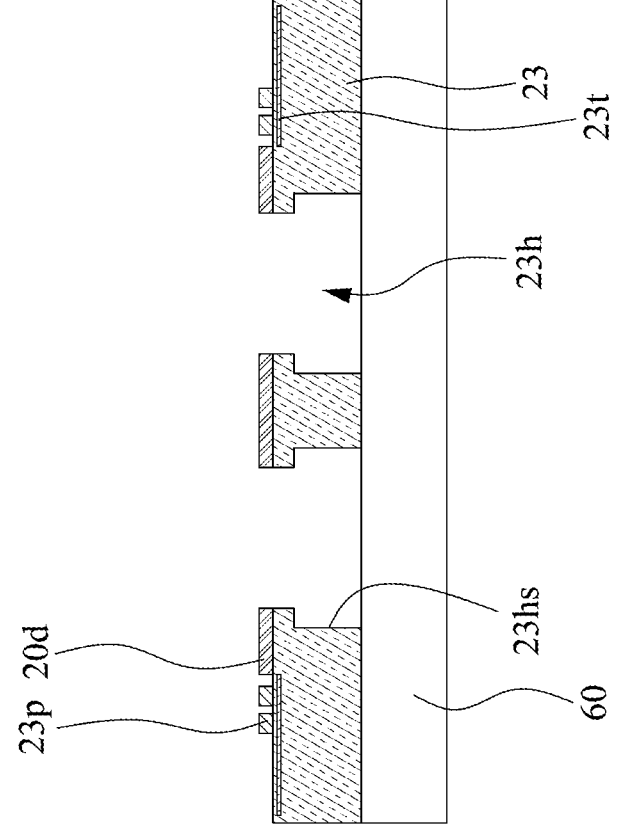

Referring to FIG. 6D, portions of the connector 23 may be removed by photolithography and anisotropic etching (e.g., DRIE), or by a laser machining operation. In some embodiments, a surface (such as a lateral surface) of the dam 20*d* may be substantially coplanar to a surface of the connector 23.

Figure 6E:
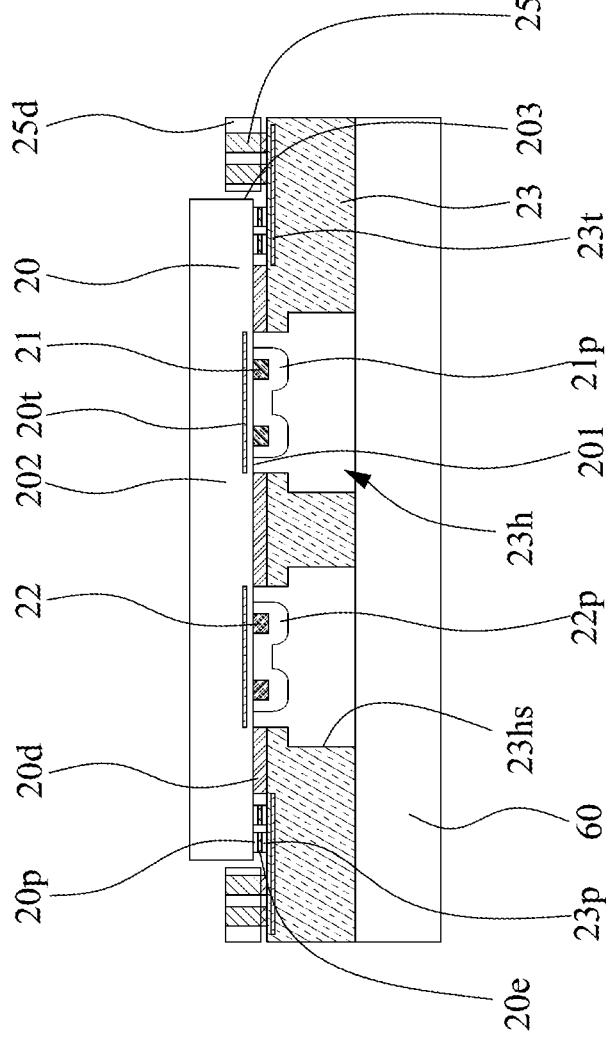

Referring to FIG. 6E, the structure obtained through FIG. 4A, FIG. 4B and FIG. 4C may be disposed on the connector 23. In addition, the conductive pillar 25 may be disposed on the connector 23. The conductive pillar 25 may be formed from the operation in FIG. 5F-1.

Figure 6F:
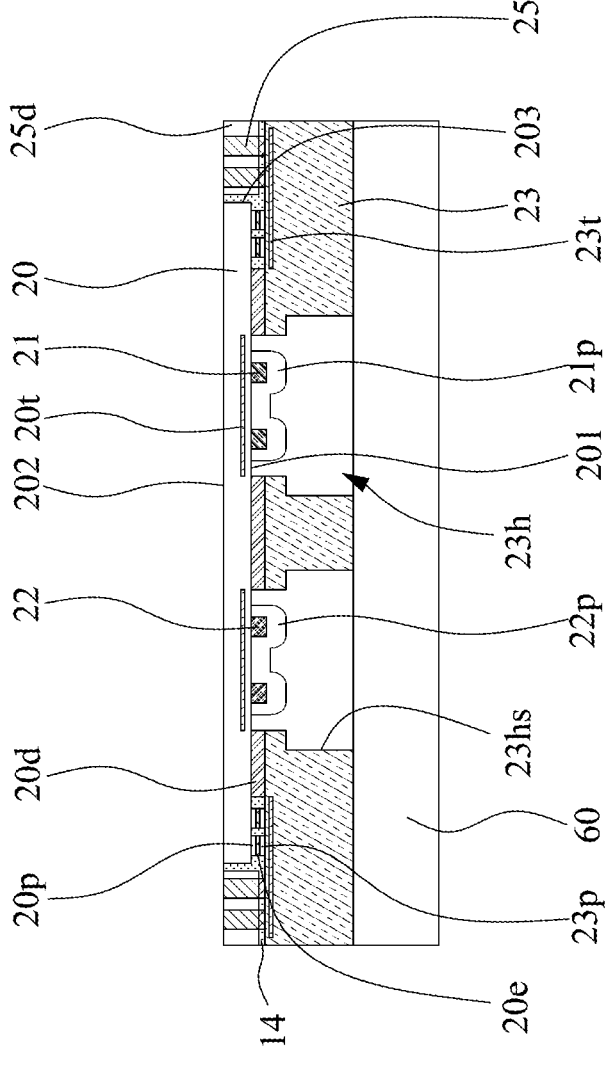
Figure 6G:
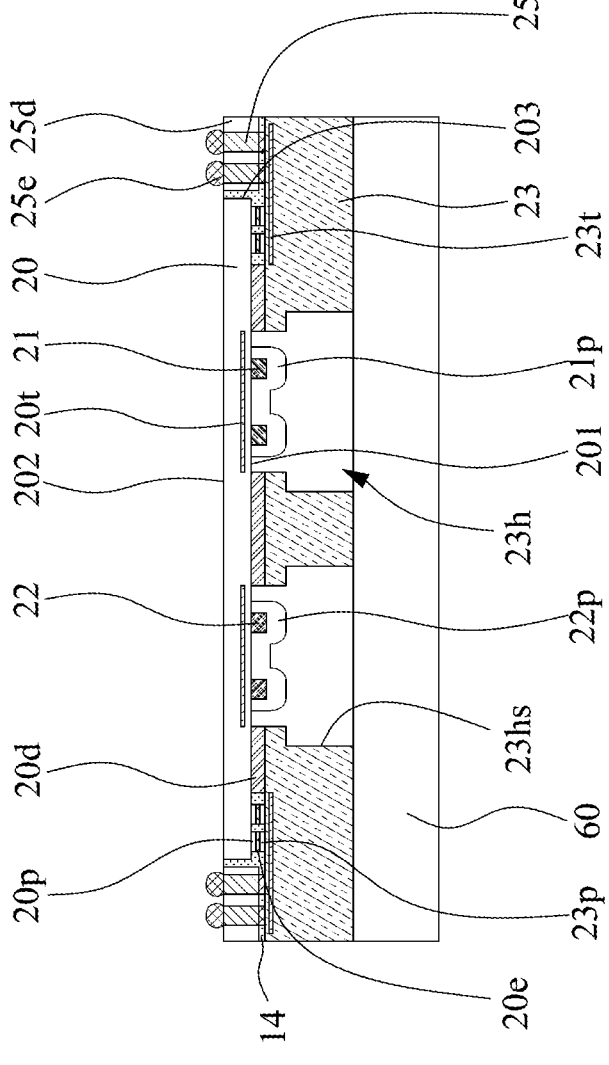

Referring to FIG. 6F, the encapsulating layer 14 may be disposed on the connector 23 to cover the component 20 and the conductive pillar 25. In addition, a grinding or polishing operation may be performed to remove a portion of the encapsulating layer 14.

Referring to FIG. 6G, the electrical contact 25*e* may be disposed on the exposed surface of the conductive pillar 25. In some embodiments, a singulation may be performed to separate out individual connectors 23, each of which is provided with one component 20.

In some embodiments, an optical test may be conducted after the component 20 is disposed on the connector 23.

Figure 6H:
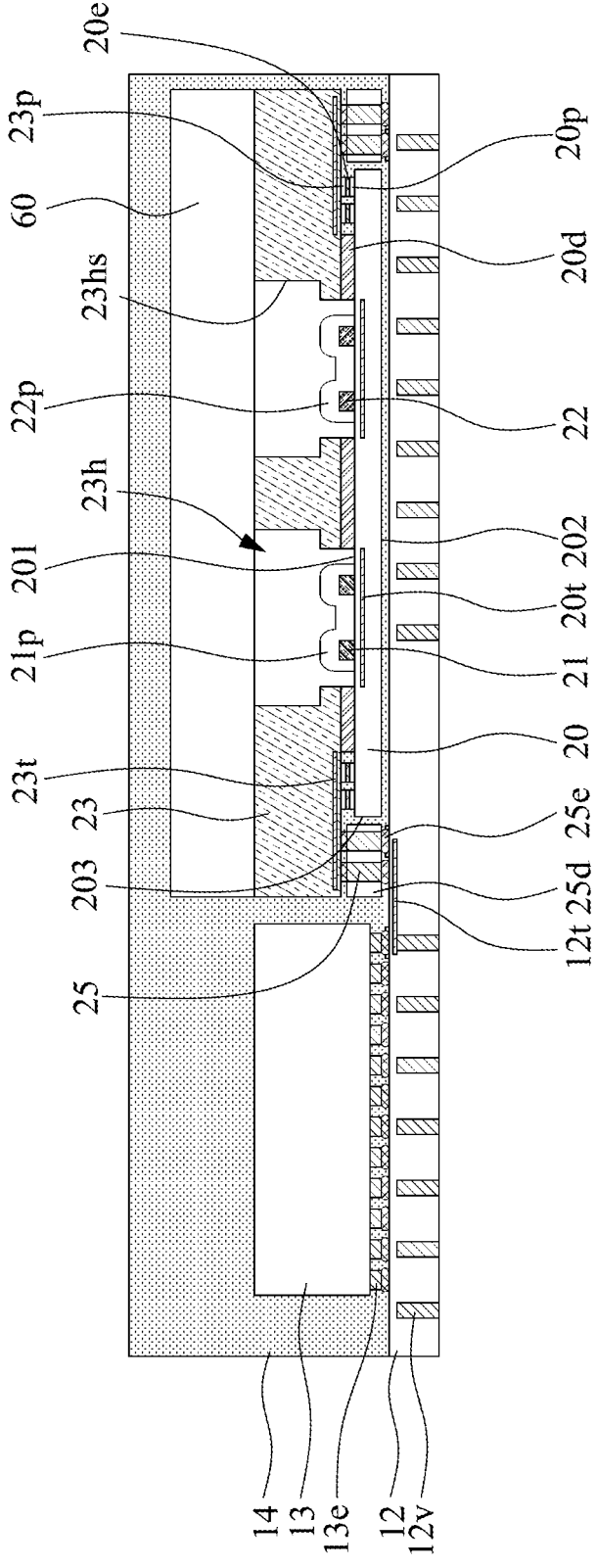

Referring to FIG. 6H, the connector 23 and the electronic component 13 may be disposed on the carrier 12.

Figure 6I:
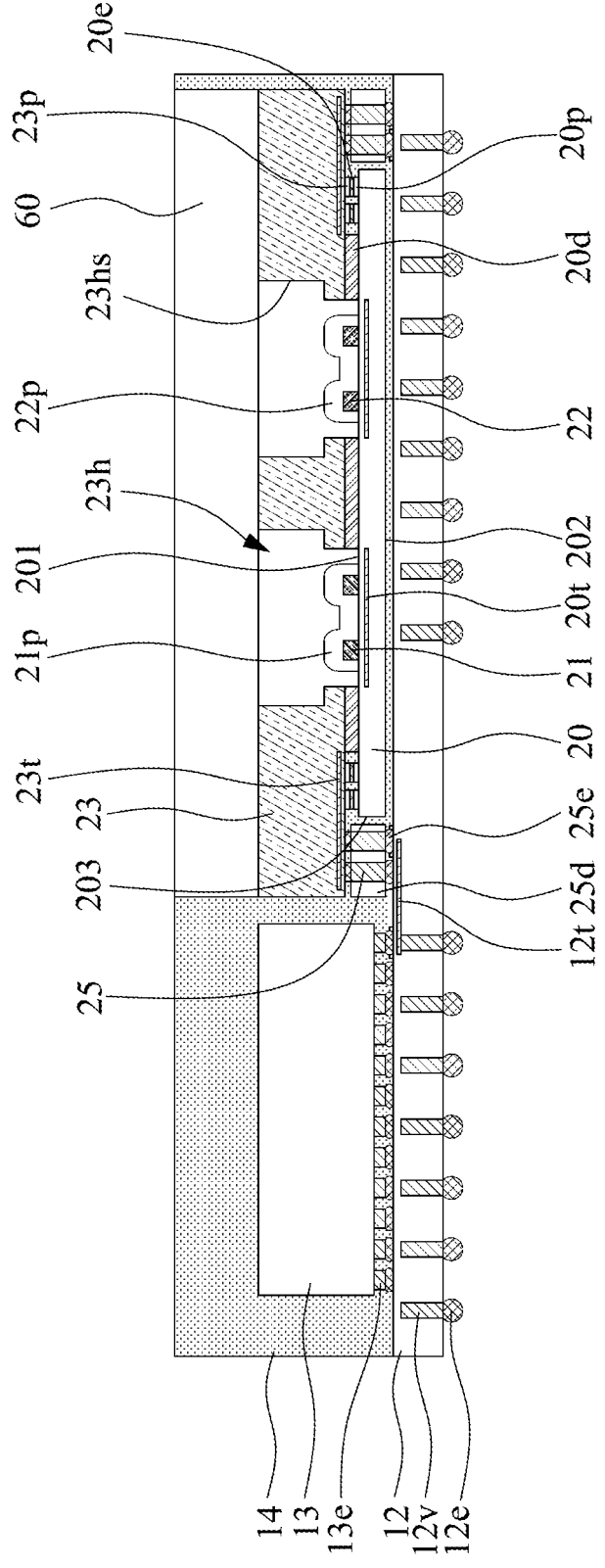

Referring to FIG. 6I, a grinding or polishing operation may be performed to remove a portion of the encapsulating layer 14. After the grinding operation, the temporary carrier 60 may be exposed. The electrical contact 12*e* may be disposed on the carrier 12.

Figure 6J:
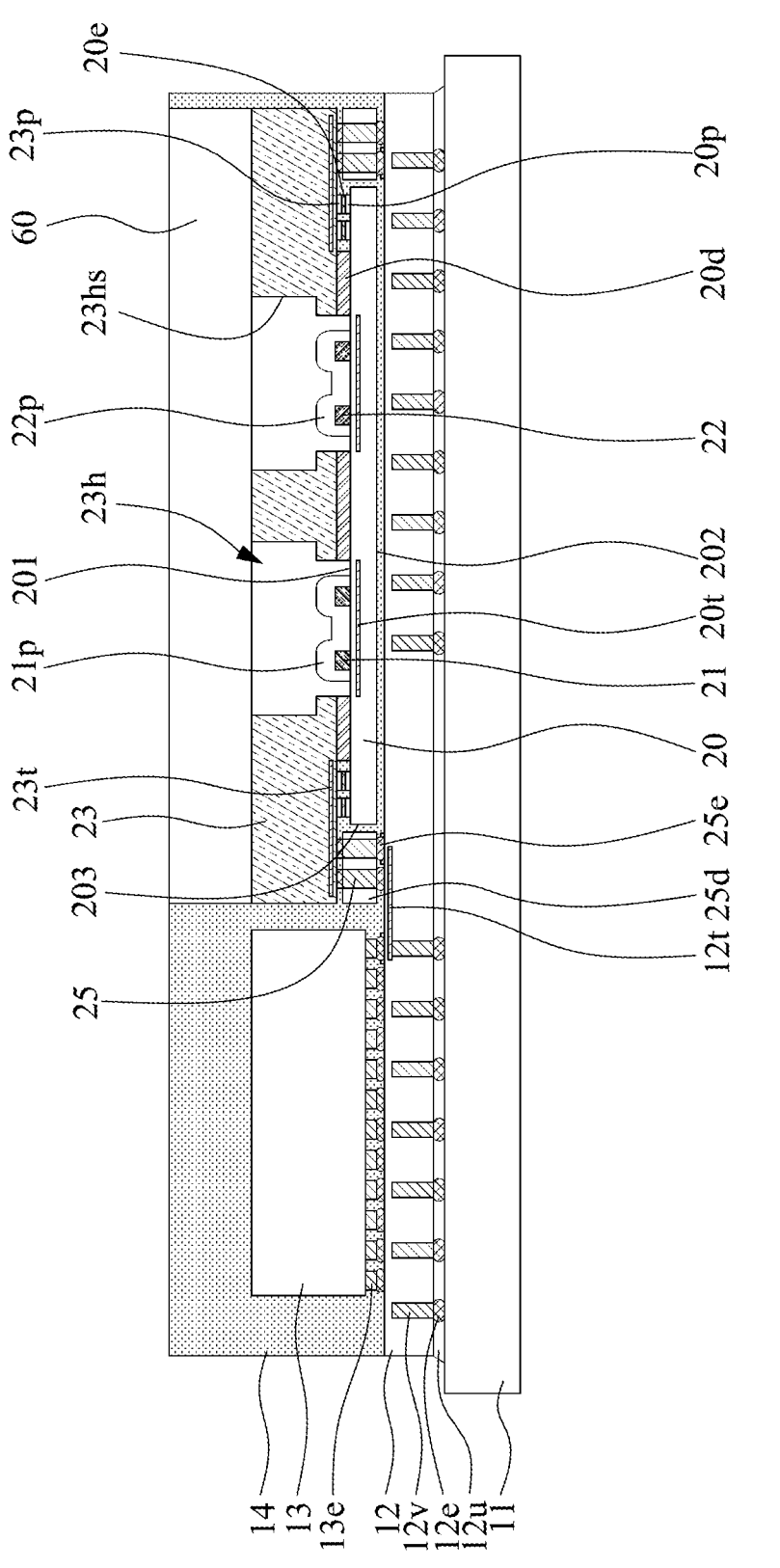

Referring to FIG. 6J, the carrier 12 may be disposed on the carrier 11 and may be electrically connected with the carrier 11 through the electrical contact 12*e*. The underfill 12*u* may be disposed between the carrier 12 and the carrier 11.

Figure 6K:
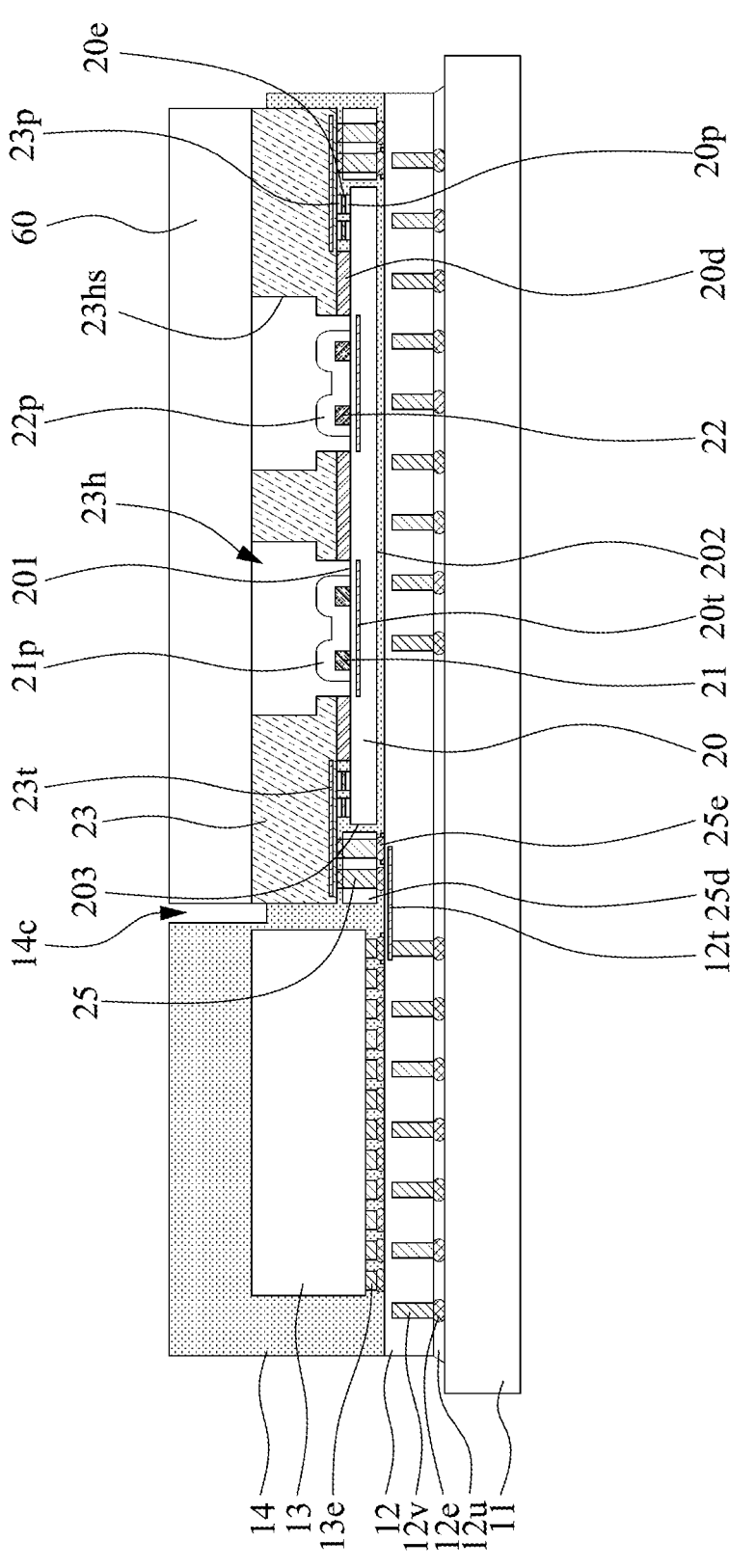

Referring to FIG. 6K, a portion of the encapsulating layer 14 may be removed by photolithography and anisotropic etching (e.g., DRIE), or by a laser machining operation. After a portion of the encapsulating layer 14 is removed, a cavity 14*c* may be formed in the encapsulating layer 14. A surface (such as a lateral surface) of the temporary carrier 60 is exposed from the cavity 14*c*.

Figure 6L:
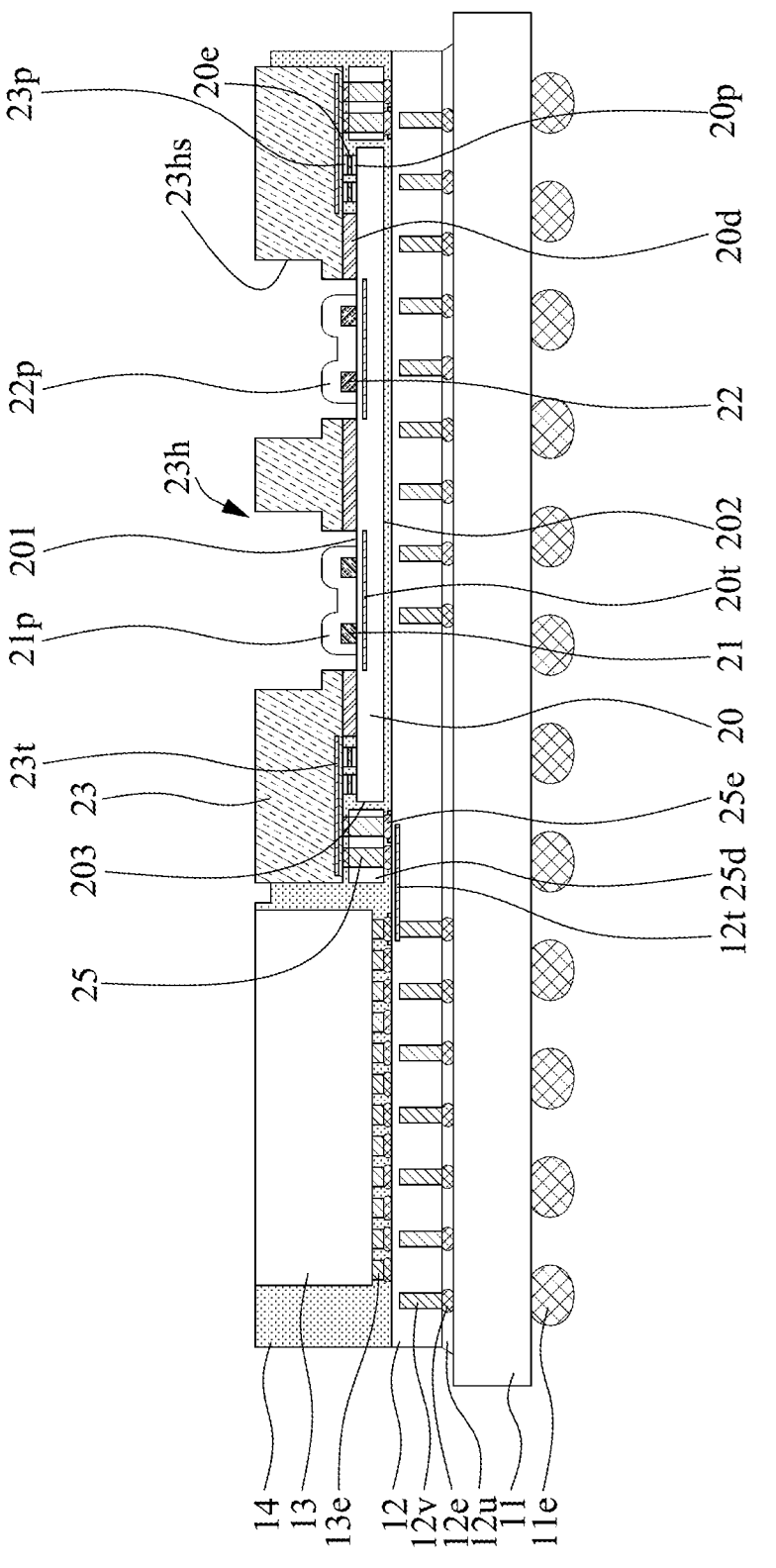

Referring to FIG. 6L, the temporary carrier 60 is removed from the connector 23. After the de-carrier operation, the receiver 21 and the transmitter 22 may each be exposed through one opening 23*h*. A grinding or polishing operation may be performed to remove a portion of the encapsulating layer 14 on the electronic component 13. The electrical contact 11*e* may be disposed on the carrier 11.

Figure 6M:
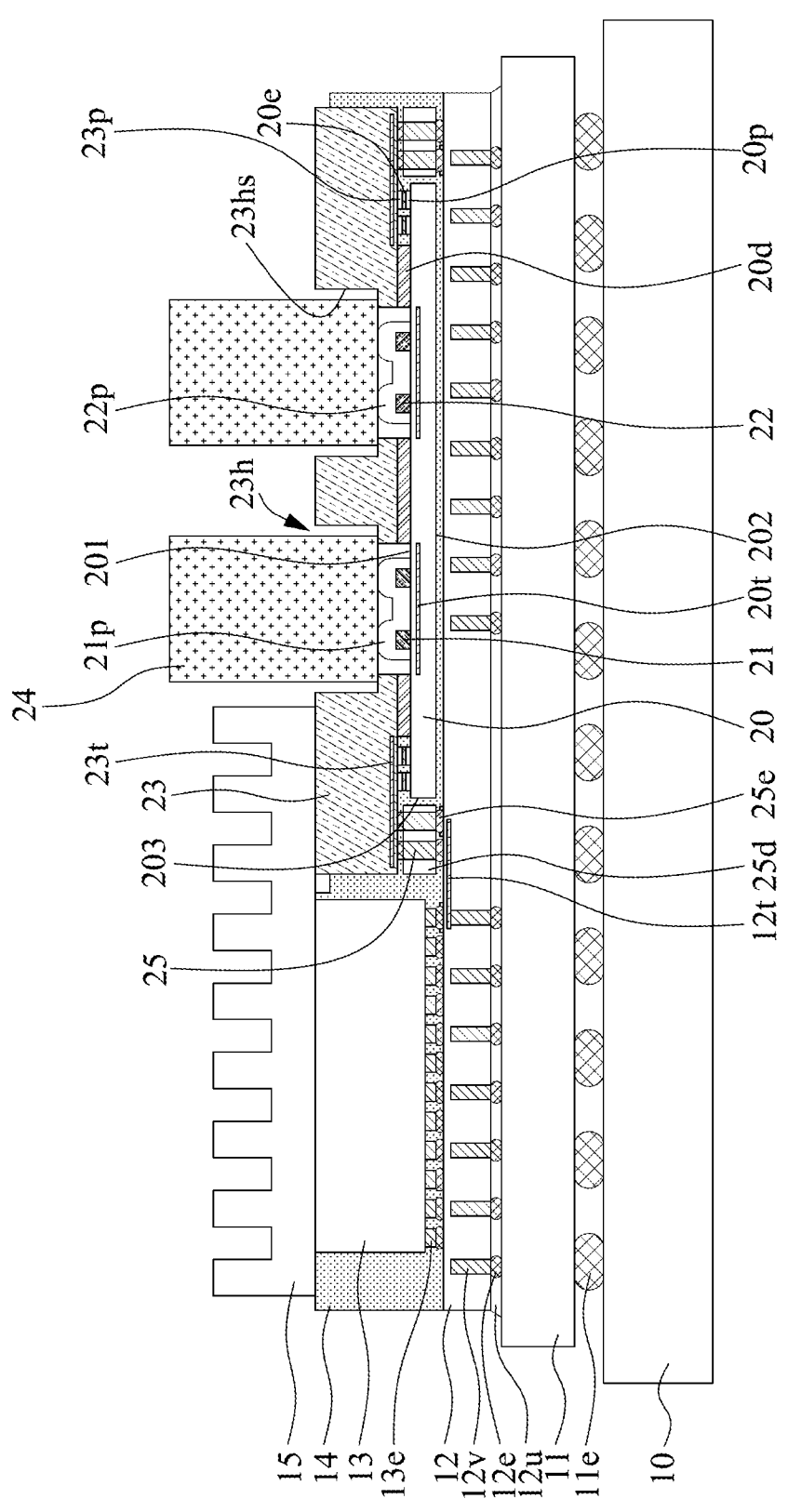

Referring to FIG. 6M, the carrier 11 may be disposed on the carrier 10 and may be electrically connected with the carrier 10 through the electrical contact 11*e*. The light carrying medium 24 may be plugged into the opening 23*h* to optically couple to the receiver 21 or the transmitter 22. The heat dissipating element 15 may be disposed on the connector 23 and the electronic component 13.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:
a carrier;
a photonic component disposed over the carrier and including an input/output (I/O) port at a first surface of the photonic component;
a connector disposed over the first surface of the photonic component and extending beyond a lateral surface of the photonic component, wherein the connector defines an opening configured to accommodate a light carrying medium,
a plurality of conductive pillars disposed between the connector and the carrier, and electrically connecting the connector to the carrier, wherein the plurality of conductive pillars surround all lateral surfaces of the photonic component, and wherein the plurality of conductive pillars and the photonic component are located at substantially same elevation with respect to the carrier;
a soldering material disposed between the connector and the photonic component, wherein the soldering material electrically connects a conductive pad of the connector to a conductive pad of the photonic component; and
an electrically insulating dam disposed between the connector and the photonic component, wherein the plurality of conductive pillars are closer to the soldering material than to the electrically insulating dam,
wherein the photonic component is electrically connected with the carrier through the connector, and
wherein the opening and the light carrying medium extend vertically with respect to the first surface of the photonic component.

2. The electronic package of claim 1, further comprising:
an electronic component disposed over the carrier and electrically connected with the photonic component through the carrier and the connector,
wherein the connector has a monolithic structure, and
wherein the I/O port of the photonic component includes a light-emitting diode (LED) or a photodiode (PD).

3. The electronic package of claim 2, further comprising:
an encapsulating layer covering the electronic component and the connector, wherein a surface of the encapsulating layer, a surface of the electronic component, and a surface of the connector are substantially coplanar, and wherein the photonic component is configured to receive an optical signal from the light carrying medium and to convert the optical signal into an electrical signal for the electronic component, and wherein the electrically insulating dam is configured to prevent the encapsulating layer from flowing into the opening.

4. The electronic package of claim 3, further comprising:
a heat dissipating element contacting the surface of the electronic component, the surface of the encapsulating layer, and the surface of the connector, wherein the photonic component and the connector do not overlap horizontally with respect to the first surface of the photonic component.

5. The electronic package of claim 4,
wherein the electrically insulating dam and the connector collectively define the opening, and wherein the electronic component overlaps horizontally with the photonic component and the connector, with respect to the first surface of the photonic component.

6. The electronic package of claim 1, wherein the opening fully penetrates the connector to expose the I/O port of the photonic component and is configure to align the light carrying medium with the I/O port.

7. The electronic package of claim 6, wherein the light carrying medium has a lower portion fully surrounded by connector.

8. The electronic package of claim 1, wherein the opening fully penetrates the connector and exposes the I/O port, and wherein the I/O port of the photonic component includes a light-emitting diode (LED) or a photodiode (PD).

9. The electronic package of claim 1, wherein a lateral surface of the connector and a lateral surface of the electrically insulating dam are substantially coplanar.

10. The electronic package of claim 1, further comprising:
a dielectric layer disposed adjacent to the photonic component and surrounding the plurality of conductive pillars; and
an encapsulating layer separating the dielectric layer from the photonic component.

11. The electronic package of claim 9, wherein the photonic component includes a second surface opposite the first surface, and the plurality of conductive pillars extend beyond the first surface of the photonic component and the second surface of the photonic component.

12. An electronic package, comprising:

a carrier;

an optical transceiver disposed over the carrier, the optical transceiver including a surface facing away from the carrier;

a connector disposed over the surface and having an overhang structure over the carrier, wherein the optical transceiver is electrically connected with the carrier through the connector;

a plurality of light carrying mediums disposed over the surface along at least two dimensions, wherein the connector has a monolithic structure and a plurality of openings fully penetrating the connector;

a plurality of conductive pillars disposed between the connector and the carrier, and electrically connecting the connector to the carrier, wherein the plurality of conductive pillars surround all lateral surfaces of the optical transceiver, and wherein the plurality of conductive pillars and the optical transceiver are located at substantially same elevation with respect to the carrier;

a soldering material disposed between the connector and the optical transceiver, wherein the soldering material electrically connects a conductive pad of the connector to a conductive pad of the optical transceiver; and an electrically insulating dam disposed between the connector and the optical transceiver, wherein the plurality of conductive pillars are closer to the soldering material than to the electrically insulating dam.

13. The electronic package of claim 12, wherein the optical transceiver and the connector do not overlap horizontally with respect to the surface of the optical transceiver, wherein the connector extends beyond opposite sides of the optical transceiver, wherein the connector is configure to align the plurality of light carrying mediums with light-emitting diodes (LEDs) or photodiodes (PDs) of the optical transceiver, and wherein each of the plurality of light carrying mediums is disposed in one corresponding opening of the plurality of openings.

14. The electronic package of claim 12, further comprising:

an electronic component disposed over the carrier and electrically connected with the optical transceiver through the carrier and the connector, wherein the optical transceiver is configured to receive an optical signal from one of the plurality of light carrying mediums and to convert the optical signal into an electrical signal, wherein the electronic component is configured to receive the electrical signal, and wherein the electronic component overlaps horizontally with the optical transceiver and the connector, with respect to the surface of the optical transceiver.

15. The electronic package of claim 12, wherein the connector has a conductive trace in the overhang structure of the connector, wherein the conductive pad of the optical transceiver is electrically connected with the conductive trace.

16. The electronic package of claim 15, wherein a lateral surface of the connector and a lateral surface of the electrically insulating dam are substantially coplanar.

17. An electronic package, comprising:

a carrier;

a photonic component disposed over the carrier and having an I/O port;

a connector disposed over the photonic component and defining an opening, wherein the I/O port is within the opening from a top view; and a plurality of conductive pillars disposed between the connector and the carrier, and electrically connecting the connector to the carrier, wherein the plurality of conductive pillars surround all lateral surfaces of the photonic component, and wherein the plurality of conductive pillars and the photonic component are located at substantially same elevation with respect to the carrier;

a soldering material disposed between the connector and the photonic component, wherein the soldering material electrically connects a conductive pad of the connector to a conductive pad of the photonic component; and an electrically insulating dam disposed between the connector and the photonic component, wherein the plurality of conductive pillars are closer to the soldering material than to the electrically insulating dam, wherein a height of the plurality of conductive pillars is greater than a thickness of the photonic component, and wherein the photonic component is electrically connected with the carrier through the connector and the plurality of conductive pillars.

18. The electronic package of claim 17, further comprising:

a first dielectric layer encapsulating a first set of the plurality of conductive pillars;

a second dielectric layer encapsulating a second set of the plurality of conductive pillars, wherein the photonic component is disposed between the first dielectric layer and the second dielectric layer; and an encapsulating layer separating the photonic component from the first dielectric layer and the second dielectric layer, and wherein the electrically insulating dam is configured to prevent the encapsulating layer from flowing into the opening.

19. The electronic package of claim 17, wherein the connector is spaced apart from the photonic component and electrically connected with the photonic component, and wherein the I/O port of the photonic component includes a light-emitting diode (LED) or a photodiode (PD), and wherein the electronic package further comprises:

an electronic component disposed over the carrier and electrically connected with the photonic component through the carrier and the connector;

an encapsulating layer covering the electronic component and the connector, wherein a top surface of the encapsulating layer, a top surface of the electronic component, and a top surface of the connector are substantially coplanar; and a heat dissipating element contacting the top surface of the encapsulating layer, the top surface of the electronic component, and the top surface of the connector.

20. The electronic package of claim 19, wherein the opening fully penetrates the connector to expose the I/O port of the photonic component and is configure to align a light carrying medium with the I/O port, wherein the electrically insulating dam is configured to maintain a gap between the photonic component and the connector, and wherein a lateral surface of the connector and a lateral surface of the electrically insulating dam are substantially coplanar.

* * * * *